United States Patent [19]

Iwama

[11] Patent Number: 5,740,053
[45] Date of Patent: Apr. 14, 1998

[54] METHOD OF CONTROLLING MONITOR USED IN CLEANING MACHINE AND OBJECT PROCESSING MACHINE AND MONITOR APPARATUS

[75] Inventor: Tatsuyuki Iwama, Tosu, Japan

[73] Assignee: Tokyo Electron Limited, Tokyo, Japan

[21] Appl. No.: 681,404

[22] Filed: Jul. 23, 1996

[30] Foreign Application Priority Data

Jul. 31, 1995 [JP] Japan ................................ 7-214121
Jul. 31, 1995 [JP] Japan ................................ 7-214122
Jul. 31, 1995 [JP] Japan ................................ 7-214123

[51] Int. Cl.$^6$ .......................... G06F 19/00; G06G 7/66
[52] U.S. Cl. ..................... 364/468.28; 364/478.01;
364/479.05; 395/188; 395/352; 395/354;
118/52; 134/2; 437/70
[58] Field of Search ................. 364/468.28, 478.01,
364/479.05; 395/188, 352, 354; 118/52;
134/2; 414/217; 437/70

[56] References Cited

U.S. PATENT DOCUMENTS

| | | | |
|---|---|---|---|
| 4,041,471 | 8/1977 | Krossa et al. | 395/825 |
| 4,532,970 | 8/1985 | Tullis et al. | 141/98 |
| 4,534,389 | 8/1985 | Tullis | 141/98 |
| 4,917,556 | 4/1990 | Stark et al. | 414/217 |
| 5,122,967 | 6/1992 | Gilham | 364/479.05 |
| 5,241,655 | 8/1993 | Mineki et al. | 395/354 |
| 5,383,482 | 1/1995 | Yamada et al. | 134/66 |
| 5,399,531 | 3/1995 | Wu | 437/205 |
| 5,470,392 | 11/1995 | Yamada et al. | 134/2 |
| 5,491,783 | 2/1996 | Douglas et al. | 395/335 |
| 5,518,542 | 5/1996 | Matsukawa et al. | 118/52 |
| 5,537,544 | 7/1996 | Morisawa et al. | 395/188.01 |
| 5,566,076 | 10/1996 | Kuroda | 364/478.01 |

FOREIGN PATENT DOCUMENTS 93 020005  1/1993  Japan ................................ G06F 3/14

OTHER PUBLICATIONS clara et al., "An Implementation of a Zero–Knowledge Protocol for a Secure Network Login Procedure", IEEE, pp. 197–201, 1989.

Craig A. Bergman, "A Password–Protected Power Controlled", IEEE, pp. 252–256, 1988.

*Primary Examiner*—Reba I. Elmore
*Assistant Examiner*—McDieunel Marc
*Attorney, Agent, or Firm*—Oblon, Spivak, McClelland, Maier & Neustadt, P.C.

[57] ABSTRACT

A display displays a processing procedure of a cleaning machine comprising a loader for loading a to-be-processed object, an unloader for unloading a processed object, and a plurality of processing units sequentially disposed between the loader and the unloader in the downstream direction to clean the to-be-processed object. A monitor controlling method of this display includes preparing a plurality of processing menus which respectively concern an ordinary operator who executes processing in accordance with an ordinary processing procedure and an expert operator who is in charge of adjustment of the cleaning machine, and which include a plurality of processing items, the step of displaying only the processing menu concerning the ordinary operator when the cleaning machine is initialized, displaying the processing menu concerning the expert operator only upon input of a password by the expert operator, and displaying, when the ordinary operator and the expert operator respectively select the processing items of the corresponding processing menus, processing information corresponding to the selected processing items.

27 Claims, 29 Drawing Sheets

FIG. 15

MANUAL MODE  1993-11-10(WED)  13:48:14

WAFER FLOW START

FILE NAME

| NO | UNIT NAME | PROCESSING TIME | |
|----|-----------|-----------------|---|
| 1 | LOADER | | ① |
| 2 | SOLUTION MIXTURE OF AMMONIA WATER AND HYDROGEN PEROXIDE WATER | 600 SECONDS | ② |
| 3 | FIRST-STAGE WATER CLEANING | | ③ |
| 4 | OVERFLOW | NO. 1 | ④ |
| 5 | HYDROFLUORIC ACID | 600 SECONDS | ⑤ |
| 6 | FIRST-STAGE WATER CLEANING | 30 SECONDS | ⑥ |
| 7 | FINAL RINSING | NO. 2 | ⑦ |
| 8 | IPA DRIER | NO. 3 | ⑧ |
| 9 | UNLOADER | NO. 4 | ⑨ |

1. WAFER FLOW NO. [ 1 ]
2. LOT ID           [<FIRST>]
                    [<SECOND>]
3. OPERATOR ID
4. PRODUCT NO.
5. WAFERCOUNT   <FIRST>
                [25]
                <SECOND>
                [25]

TO START WAFER FLOW, TOUCH F1 "LOT START" KEY.

| LOT START | LOT CANCEL | | SYSTEM INFORMATION | DIRECTORY DISPLAY | | ALARM | MENU |

NORMAL MODE

FIG. 18

| | LOAD | C-W | SC1 | QDR | OF | HF | QDR | OF | FR | IPA | UN-L |
|---|---|---|---|---|---|---|---|---|---|---|---|
| | IDLE | IDLE | IDLE | IDLE | IDLE | IDLE | IDLE | IDLE | IDLE | IDLE | IDLE |
| | | | | | | | | | | | |
| | | | | | | | | | | | |
| | | | | | | | | | | | |

MANUAL MODE     1993-11-10(WED)   13:48:14

TOTAL TIME = [0000:16:18]    DEVICE NAME = [   ]
MANUFACTURING TIME = [0000:00:00]
MANUFACTURE AVAILABILITY = [ 0.0 % ]    DISPLAY MODE = [REAL TIME (FIRST DISPLAY)]

PROCESSING TIME    0000 0000 0000 0000 0000 0000 0000 0000 0000 0000 0000
PRESET PROCESSING TIME 0000 0000 0000 0000 0000 0000 0000 0000 0000 0000 0000
EXCHANGE TIME      0000 0000      0000      0000      0000
PRESET EXCHANGE TIME   0000 0000      0000      0000      0000
EXCHANGE COUNT      0000        0000      0000      0000
PRESET EXCHANGE COUNT 0000        0000      0000      0000

| LOT INFORMATION | ALARM INFORMATION | | | | |
|---|---|---|---|---|---|
| WAFER START | | SWITCH DISPLAY | ENTER NAME | SELECT ITEM | ALARM | MENU |

MANUAL MODE 1993-11-10(WED) 13:48:14

TAKE-OUT PROCESSING

[PROCESSING]

1. CONTINUE PROCESSING
2. FR, DRY
3. FORCED TRANSFER

| LOT STATUS | |
|---|---|
| NORMAL DISPLAY... | NORMAL PROCESSING BEING PERFORMED |
| REVERSE DISPLAY.. | TAKE-OUT PROCESSING BEING PERFORMED |
| NORMAL FLASH DISPLAY ‒ | TAKE-OUT PROCESSING CAN BE INSTRUCTED |
| REVERSE FLASH DISPLAY ‒ | TAKE-OUT PROCESSING INSTRUCTION TARGET |

| UNIT NAME | IN | C-W | APM | QDR | OF | HF | QDR | OF | FR | IPA | OUT |
|---|---|---|---|---|---|---|---|---|---|---|---|
| PROCESSING FLOW NO. | | | | | | | | | | | |

SELECT TAKE-OUT PROCESSING WITH CURSOR
('↓' OR '↑') AND DETERMINE WITH 'ENTER' KEY

ALARM  MENU

NORMAL MODE

F I G. 22

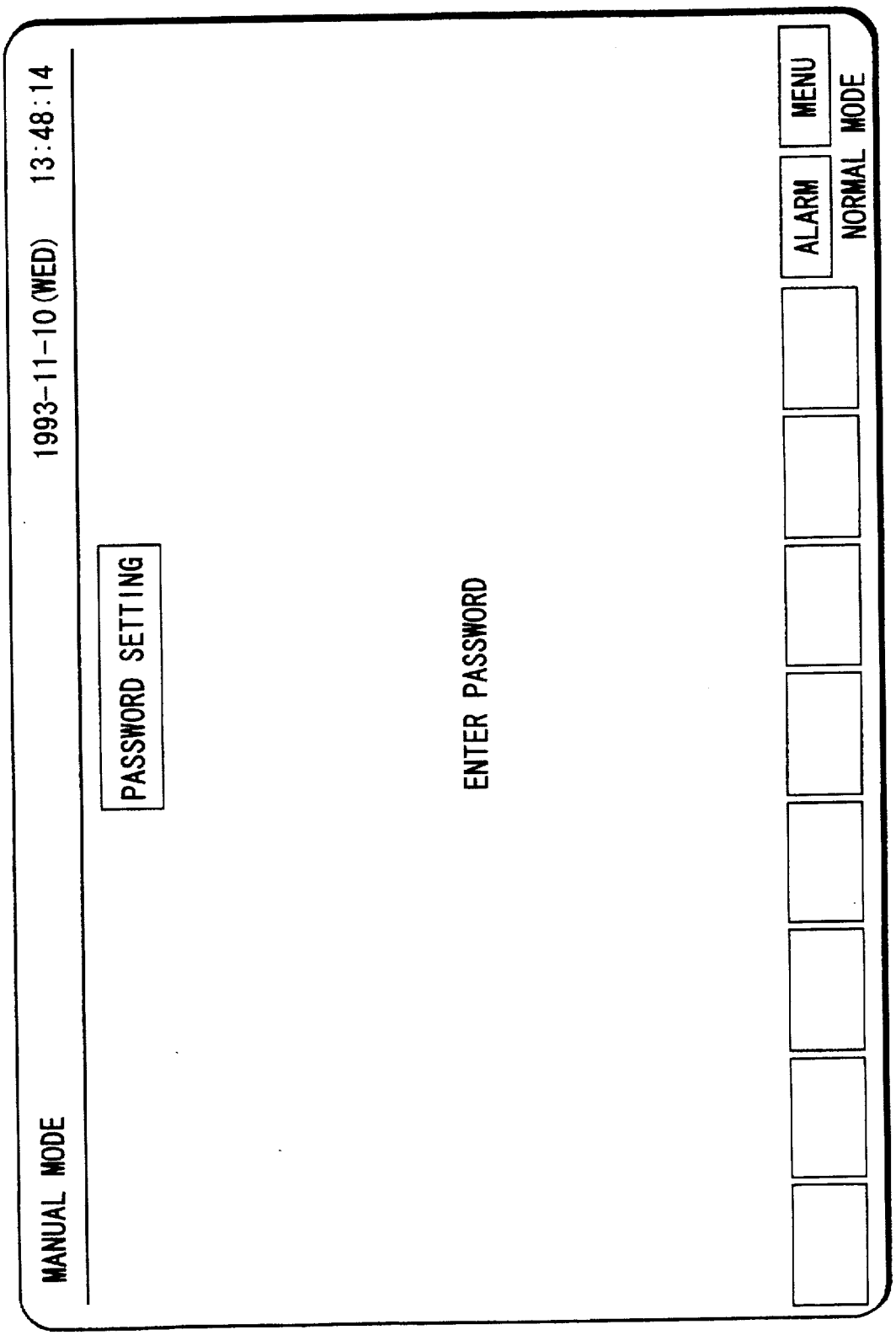

MANUAL MODE                                    1993-11-10(WED)   13:48:14

WAFER FLOW EDIT

| | UNIT NAME | PROCESSING | INTRODUCTION | MULTI | ARM |
|---|---|---|---|---|---|
| 1 | LOADER | | | | |
| 2 | SOLUTION MIXTURE OF AMMONIA WATER/HYDROGEN PEROXIDE WATER | ② 600 SECONDS | 0 | 0 | 0 |
| 3 | FIRST-STAGE WATER CLEANING | ④ NO. 1 | | 0 | |
| 4 | OVERFLOW | ⑤ 600 SECONDS | 0 | 0 | |
| 5 | HYDROFLUORIC ACID | ⑥ 30 SECONDS | 0 | 0 | 1 |
| 6 | FIRST-STAGE WATER CLEANING | ⑦ NO. 2 | | 0 | |
| 7 | FINAL RINSING | ⑧ NO. 3 | | 0 | |
| 8 | IPA DRIER | ⑨ NO. 4 | | 0 | |
| 9 | UNLOADER | | | | |

[PROCESSING]

NO. ?? : RECIPE NO.
?? SECONDS : PROCESSING TIME (0 DESIGNATED =
 PASSWORD DESIGNATED)

WAFER MENU    EDIT RECIPE   REGISTER   INITIALIZE          ALARM   MENU

NORMAL MODE

F I G. 26

METHOD OF CONTROLLING MONITOR USED IN CLEANING MACHINE AND OBJECT PROCESSING MACHINE AND MONITOR APPARATUS

BACKGROUND OF THE INVENTION

1. Field of the Invention

The present invention relates to a method of controlling the monitor of an object processing machine and a cleaning machine that process an to-be-processed object, e.g., a semiconductor wafer and a monitor apparatus.

2. Description of the Related Art

Cleaning in a manufacturing process will be described by way of cleaning in the manufacturing process of a semiconductor device, e.g., an LSI. Semiconductor wafer cleaning machines are conventionally used for removing contaminants, e.g., particles, organic contaminants, and metal impurities, on the surface of a semiconductor wafer. Among these machines, a wet type cleaning machine is widely used as it can remove particles effectively and can perform batch processing.

In a cleaning machine of this type, a storing member called a carrier storing a predetermined number of, e.g., 25 semiconductor wafers is loaded to the loader section of the cleaning machine by a transfer robot. After they are subjected to orientation flat alignment, the semiconductor wafers stored are removed from the carrier by a holding unit in a wafer holder, and are placed in a transfer stand-by state. The semiconductor wafers in the transfer stand-by state are transferred with a transfer machine having a chucking unit called a wafer chuck to a cleaning section that performs various types of cleaning operations, and are subjected to predetermined cleaning operations in the cleaning section.

The cleaning section is formed by arranging one or at least two cleaning units for performing various types of chemical cleaning operations, e.g., SC1 cleaning (RCA standard Cleaning-1, cleaning with a solution mixture of ammonia water and hydrogen peroxide water), SC2 cleaning (RCA standard Cleaning-2, with a solution mixture of hydrocloric acid and hydrogen peroxide water), HF (fluoric acid solution) cleaning, and SPM cleaning (Sulfuric acid Perhydroxide Mixture cleaning). Each cleaning unit is constituted by a chemical bath for performing chemical cleaning and a water bath for performing pure water cleaning. A to-be-processed object which is transferred to a certain cleaning unit by the transfer machine is chemically cleaned in the chemical bath, and is then transferred to the water bath arranged downstream the chemical bath. After the chemical attaching to the surfaces of the semiconductor wafers is washed off with pure water in the water bath, the semiconductor wafers are transferred to a cleaning unit that performs cleaning with a different type of chemical. Semiconductor wafers that have undergone a series of cleaning operations in this manner are finally cleaned with pure water, dried, and unloaded to outside the object processing machine through an unloader section.

The cleaning operations in the cleaning machine as described above are usually executed as the operator proceeds with the operation in accordance with a control menu displayed on the display device of a controller constituted by a personal computer, a workstation, and the like. In this case, an engineer menu is also displayed in addition to an ordinary operator menu. Therefore, if the displayed engineer menu is not protected by a password or the like at all, an ordinary operator can easily access even a recipe forming menu, a maintenance menu, and a service menu that should not originally be accessed by but an operator having a predetermined knowledge. Hence, the wafer recipe, the device parameter, the fixed parameter, the bath parameter and the like that significantly influence the operation of the machine may be altered or falsified inadvertently, carelessly, or intentionally. Even if the engineer menu is protected by a password or the like, the engineer menu itself is displayed in the main menu. Thus, the ordinary operator is constantly tempted to access the engineer menu. If the password is not strictly controlled or becomes known to the ordinary operator for some reason, the ordinary operator can access the engineer menu, leading to the possibility of the various parameters being altered or falsified.

Conventionally, the control screen of an object processing machine, e.g., a cleaning machine, includes machine data image indicating various types of data concerning the machine. The operator can confirm the status of the cleaning machine by referring to the machine data image as required. Data concerning the machine vary. If all the data are displayed every time the operator refers to the machine data, the status confirming operation becomes very cumbersome. Therefore, a flexible data display method has been sought after.

SUMMARY OF THE INVENTION

It is an object of the present invention to provide a novel, improved screen controlling method that can warrant system security even if the operator leaves the system while he or she operates the monitor.

It is another object of the present invention to provide a novel, improved screen controlling method that can display various types of data pertaining to the machine in an optimum manner.

According to the present invention, there is provided a monitor controlling method of a display which displays a processing procedure of an object processing machine comprising a transfer section for transferring a to-be-processed object and a processed object, and at least one processing unit for processing the to-be-processed object, comprising the steps of preparing a plurality of processing menus which respectively concern an ordinary operator who executes processing in accordance with an ordinary processing procedure and an expert operator who is in charge of adjustment of the object processing machine, and which include a plurality of processing items; displaying only the processing menu concerning the ordinary operator when the object processing machine is initialized; displaying the processing menu concerning the expert operator only upon input of a password by the expert operator; and displaying, when the ordinary operator and the expert operator respectively select the processing items of the corresponding processing menus, processing information corresponding to the selected processing items.

According to the present invention, there is provided a monitor controlling method of a display which displays a processing procedure of a cleaning machine comprising a transfer unit for transferring a to-be-processed object and a processed object, and a plurality of cleaning units for cleaning the to-be-processed object transferred by the transfer unit, comprising the steps of preparing a plurality of processing menus which respectively concern an ordinary operator who executes processing in accordance with an ordinary processing procedure and an expert operator who is in charge of adjustment of the cleaning machine, and which include a plurality of processing items; displaying, when the cleaning machine is initialized, fixed information which is included in the processing menu concerning the ordinary operator and is fixedly determined by the cleaning machine, and user information including processing items selected in advance by a user from processing items of the cleaning machine; displaying the processing menu concerning the expert operator only upon input of a password by the expert operator; and displaying, when the ordinary operator and the expert operator respectively select the processing items of the corresponding processing menus, processing information corresponding to the selected processing items.

According to the present invention, there is provided a monitor apparatus for monitoring a processing procedure of an object processing machine comprising a transfer section for transferring a to-be-processed object and a processed object, and at least one processing unit for processing the to-be-processed object, comprising: a storing section for storing a plurality of processing menus which respectively concern an ordinary operator who executes processing in accordance with an ordinary processing procedure and an expert operator who is in charge of adjustment of the object processing machine, and which include a plurality of processing items; an input section operated by the expert operator for inputting a password; a read out section for reading out only the processing menu concerning the ordinary operator from the storing section when the object processing machine is initialized, and the processing menu concerning the expert operator from the storing section only when the password is input by the expert operator; and a display section for displaying the processing menus concerning he ordinary operator and the expert operator read out by the read out section, respectively, and for displaying, when the ordinary operator and the expert operator respectively select the processing items of the corresponding processing menus, processing information corresponding to the selected processing items.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 15 is an explanatory view showing a wafer flow start menu;

FIG. 18 shows a screen displaying information on the first device in the manual mode;

FIG. 22 shows a take-out processing menu;

FIG. 23A shows a password setting screen displayed after input of a password;

FIG. 26 shows a wafer flow edit screen;

DETAILED DESCRIPTION OF THE PREFERRED EMBODIMENTS

Figure 1:
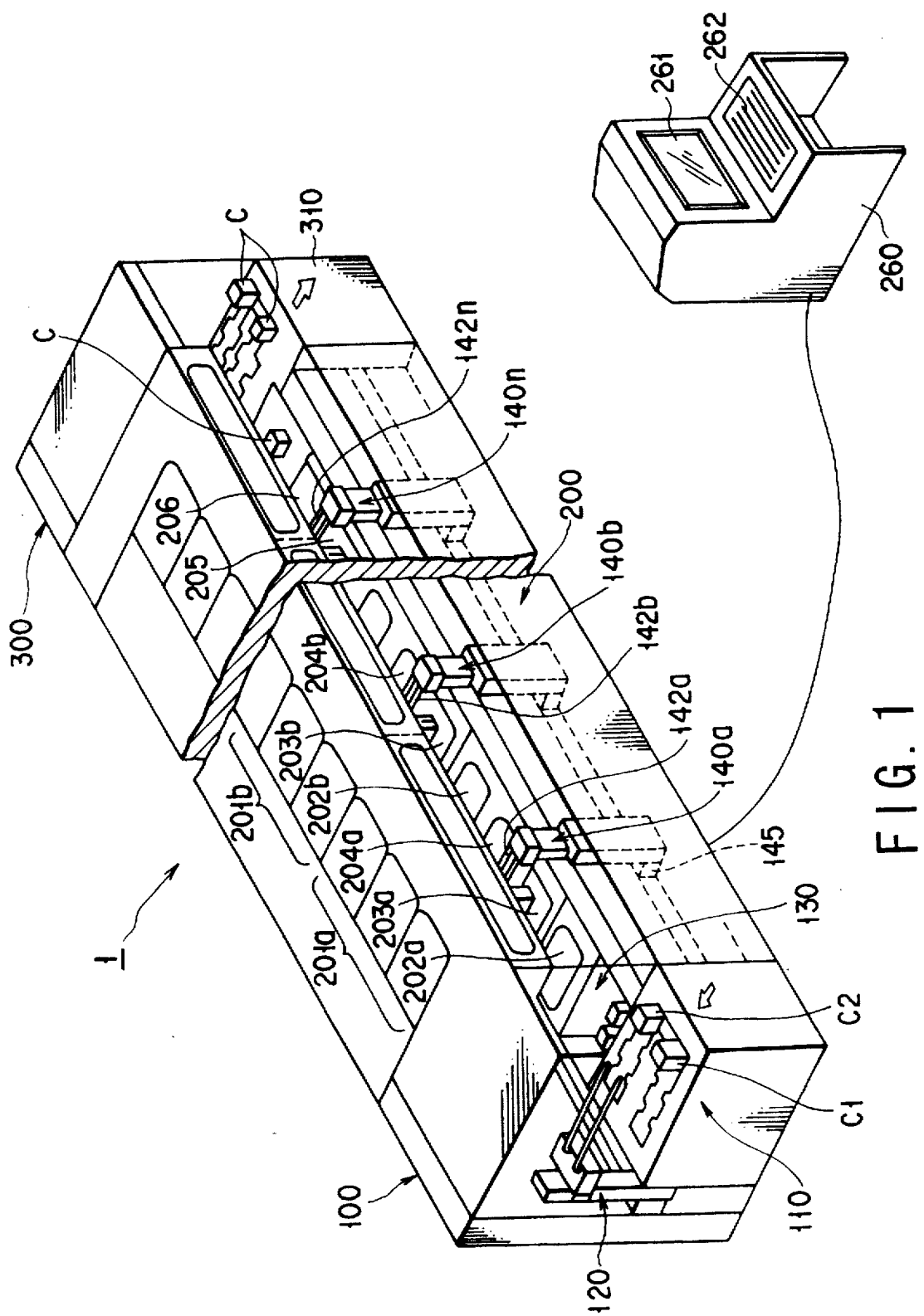
FIG. 1 is a schematic perspective view of an embodiment of a cleaning machine which is constituted based on the present invention.

As shown in FIG. 1, a cleaning machine 1 is constituted by three zones, i.e., a loader section 100 for storing to-be-processed objects before cleaning, e.g., semiconductor wafers, in units of carriers, a cleaning section 200 for cleaning the wafers, and an unloader section 300 for unloading the cleaned wafers to outside the cleaning machine 1 in units of carriers.

Figure 2:
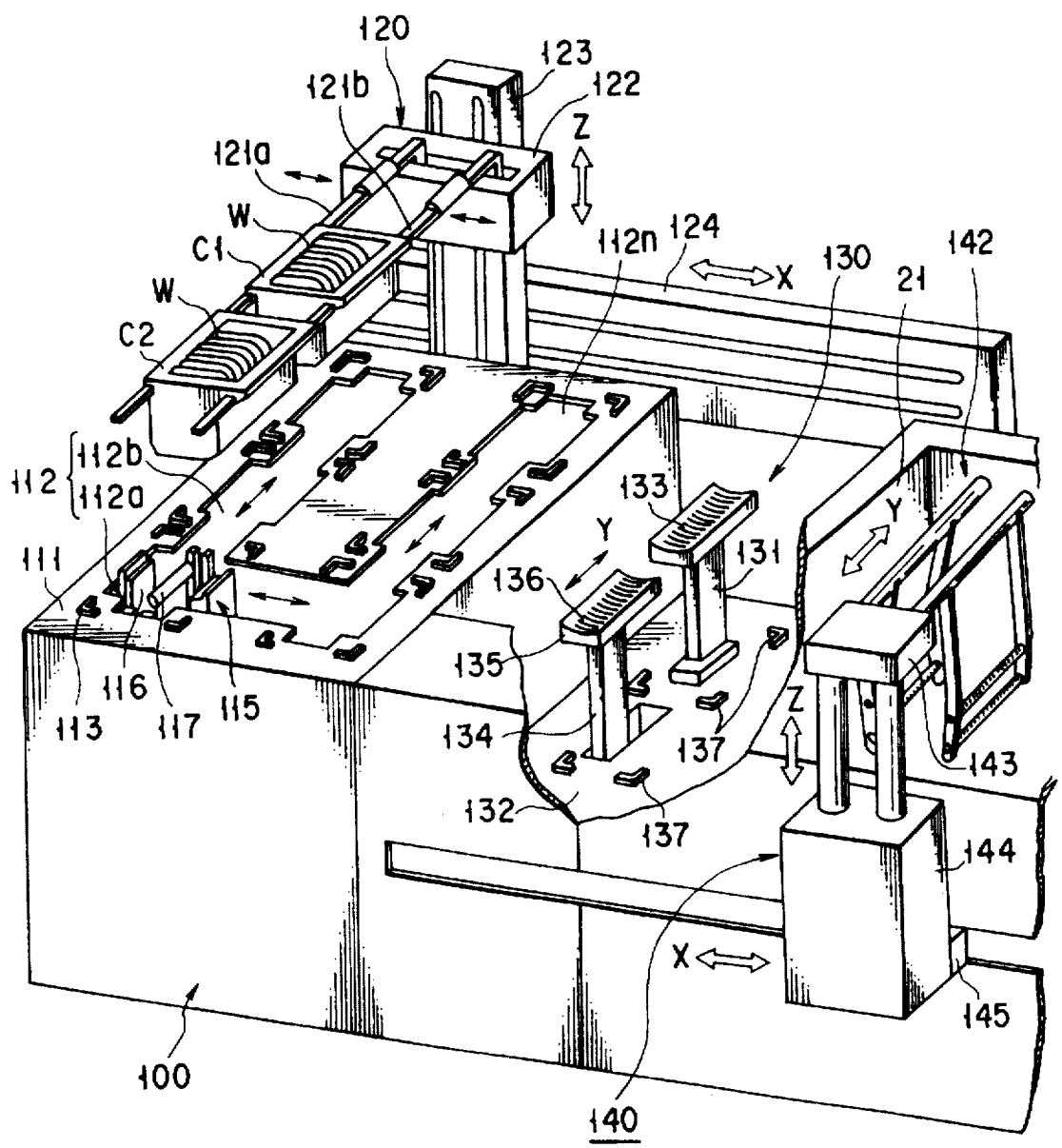
FIG. 2 is an enlarged perspective view of an example of the loader section of the cleaning machine shown in FIG. 1.

The loader section 100 is constituted by a platform 110, a conveyer machine 120, and a relay section 130. A carrier C storing a predetermined number of, e.g., 25 uncleaned wafers is loaded and placed on the platform 110. The conveyer machine 120 conveys the carrier C placed on the platform 110 to holders 133 and 135 (shown in FIG. 2 in an enlarged scale). The relay section 130 extracts a wafer from the carrier C and transfers it to a wafer transfer machine or unit 140. The platform 110 has a hollow platform table 111, as shown in FIG. 2. Two rows of a plurality of stations 112a, 111b, . . . , 112n, each having an opening through which the lower portion of the carrier C can be inserted, are aligned on the upper surface of the platform table 111. Locking portions 113 capable of locking the upper-side corner portions of the carrier C are formed near the respective corner portions of each station 112.

The loader section 100 has a moving mechanism 115 which can be driven by a driving mechanism (not shown) in the vertical and horizontal directions. The moving mechanism 115 can move the carrier C held by a clamp member 116 to a desired station 112a, 112b, . . . , or 112n. The moving mechanism 115 has an alignment unit 117 for aligning the orientation flats of the wafers W stored in the carrier C. Thus, orientation flat alignment of the stored wafers can be performed while the carrier C is being moved.

As shown in FIG. 2, the conveyer machine 120 is provided behind the loader section 100. The conveyer machine 120 is constituted by a pair of arms 121a and 121b, a lifter 122, a Z base 123, and an X base 124. The pair of arms 121a and 121b can move close to and away from each other. The lifter 122 horizontally supports the arms 121a and 121b. The Z base 123 moves the lifter 122 in the vertical direction (Z direction). The X base 124 moves the Z base 123 itself in the longitudinal direction (X direction) of the cleaning machine. While the two upper side portions of the carrier C are placed on the arms 121a and 121b, the conveyer machine 120 clamps the outer side surfaces of the carrier C with the arms 121a and 121b to convey the carrier C to the relay section 130 shown in FIG. 1.

As shown in FIG. 2, the relay section 130 has a holder 133 fixed on an upper plate 132 through a support post 131, and a holder 135 supported by a moving post 134 in the Y direction. The moving post 134 is movable with respect to the upper plate 132 in the Y direction. Each of the holders 133 and 135 has such a shape that it can pass through the opening portion of the bottom surface of the carrier C. A predetermined number of, e.g., 25 arcuated holding grooves 136, are formed in the upper surface of each of the holders 133 and 135 to correspond in number to the wafers stored in the carrier C. The holding grooves 136 receive parts of the peripheries of wafers W to set the wafers W upright substantially vertically. Four locking members 137 for locking the corner portions of the lower end portion of the carrier C are formed on the upper plate 132 close to the respective base portions of the support post 131 and moving post 134.

Figure 3:
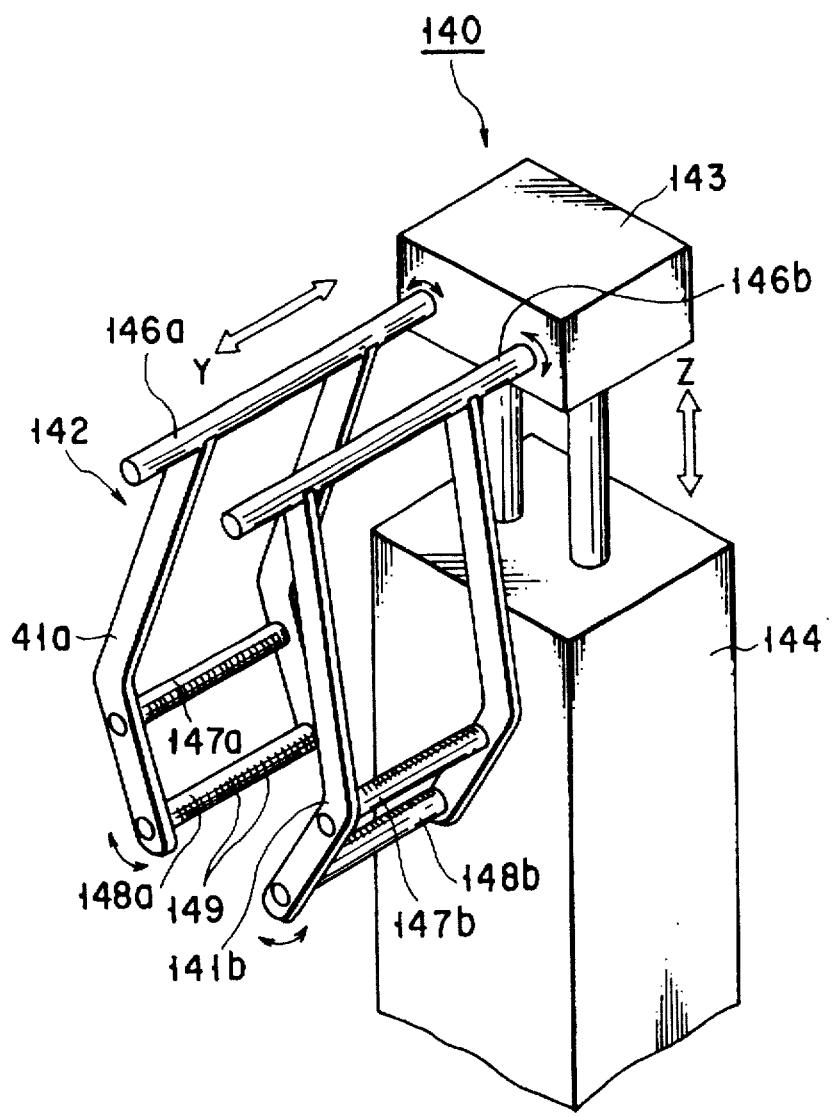
FIG. 3 is a perspective view of part of the wafer transfer unit of the cleaning machine shown in FIG. 1.

Each wafer transfer unit 140 for chucking the wafers W held by the holders 133 and 135 at once and transferring them to the cleaning section 200 has an arrangement as shown in FIG. 3. More specifically, the wafer transfer machine 140 is constituted by a wafer chuck 142, a holder 143, a driving mechanism 144, and a transfer base 145 (see FIG. 2). The wafer chuck 142 is constituted by a pair of right and left chuck members 141b and 141a for chucking, e.g., 50 wafers at once. The holder 143 includes an open/close mechanism for opening or closing the chuck members of the wafer chuck 142 and a mechanism for moving the wafer chuck 142 in the forward and backward directions (that is, Y direction). The driving mechanism 144 moves the holder 142 in the upper and lower directions (that is, Z direction). The driving mechanism 144 moves the holder 143 in the vertical direction (Z direction) and moves it forward/backward (Y direction). The transfer base 145 moves the driving mechanism 144 in the longitudinal direction (X direction) of the cleaning section 200.

The chuck members 141a and 141b of the wafer chuck 142 are symmetrical, and their rotating shafts 146a and 146b are pivotally supported by the holder 143. Thus, the chuck members 141a and 141b can freely open/close. The upper end portions of the chuck members 141a and 141b made of quartz are respectively fixed to the rotating shafts 146a and 146b. Upper and lower chuck rods 147a and 148a, and upper and lower chuck rods 147b and 148b made of silica extend between the lower end portions of each of the chuck members 141a and 141b to be parallel to each other. For example, 50 chuck grooves 149 are formed in the opposite surfaces of the chuck rods 147a, 147b, 148a, and 148b to receive the peripheral portions of the wafers W. When the rotating shafts 146a and 146b are rotated, the chuck members 141a and 141b chuck the wafers W with their chuck rods 147a, 147b, 148a, and 148b, and transfer them to a desired position in the vertical direction (Z direction) and longitudinal direction (X direction).

These wafer transfer machines 140 are provided in order to transfer wafers among cleaning units 201a, 201b, . . . , 201n to be described later, and can move a lot including a predetermined number of wafers by moving the transfer base 145. For example, the wafer transfer machine 140a can convey wafers in units of lots between the loader section 100 and the first-stage cleaning unit 201a of the cleaning section 200 and between the first-stage cleaning unit 201a and the second-stage cleaning unit 201b. The wafer transfer machine 140b can convey wafers in units of lots between the first-stage cleaning unit 201a and the second-stage cleaning unit 201b. The wafer transfer machine 140n can transfer wafers in unit of lots between the (n−1)-stage cleaning unit 201(n−1) and the n-stage cleaning unit 201n, and between the n-stage cleaning unit 201n and the unloader section 300.

The wafers are transferred between the adjacent cleaning units 201 through a second-stage water bath (interface bath) 202 to be described later, and can be conveyed to a wafer holder 212 (see FIG. 4) (to be described later) provided to a predetermined chemical bath 202 or a water bath 203, 204 or 205. The bath 203 may be selectively used for water cleaning or chemical cleaning.

The cleaning section 200 will be described. The cleaning section 200 is formed by sequentially arranging a plurality of cleaning units 201a, 201b, . . . , 201n (first-stage cleaning unit to n-stage cleaning unit), as shown in FIG. 1. Each cleaning unit 201 is constituted by, e.g., a chemical bath 202, a first-stage water bath 203, and a second-stage water bath 204. After wafers W are chemically cleaned in the chemical bath, the chemical attaching the wafers W is cleaned in the first- and second-stage water baths 203 and 204 with pure water, and the wafers W are transferred to a downstream cleaning unit with the wafer transfer machine 140. Furthermore, a final water bath 205 for performing final cleaning with pure water, and a drying bath 206 for drying the wafers W that have undergone cleaning with, e.g., IPA (isopropyl alcohol) are sequentially arranged on the downstream end side in the cleaning section 200 to perform a series of cleaning operations.

In each cleaning unit, a predetermined chemical solution is supplied into its processing bath in accordance with the type of contaminants attached to the surfaces of wafers, e.g., organic impurities, metal impurities, and the like, to chemically clean the wafers. For example, when the surfaces of wafers are contaminated with organic matter, so-called SC1 cleaning can be performed with a solution mixture of ammonia water and hydrogen peroxide water. Natural oxide films and metal impurities can be removed by so-called HF cleaning with an HF solution. Furthermore, a clean natural oxide film can be formed on the wafers while removing metal impurities attaching to bear silicon by performing so-called SC2 cleaning with a solution mixture of hydrochloric acid and hydrogen peroxide water. Regarding a typical cleaning method based on hydrogen peroxide, i.e., the so-called RCA cleaning method, the wafers can be cleaned by sequentially performing SC1 cleaning HF cleaning SC2 cleaning with corresponding cleaning units.

The structure of a typical processing bath that can be employed in the cleaning machine which is fabricated based on the present invention will be described with reference to FIGS. 4 and 5 by way of an SC1 cleaning bath section 210. The basic structures of other types of chemical baths and water baths are identical to those of the SC1 cleaning bath which will be described hereinbelow, and its detailed description will thus be omitted.

Figure 4:
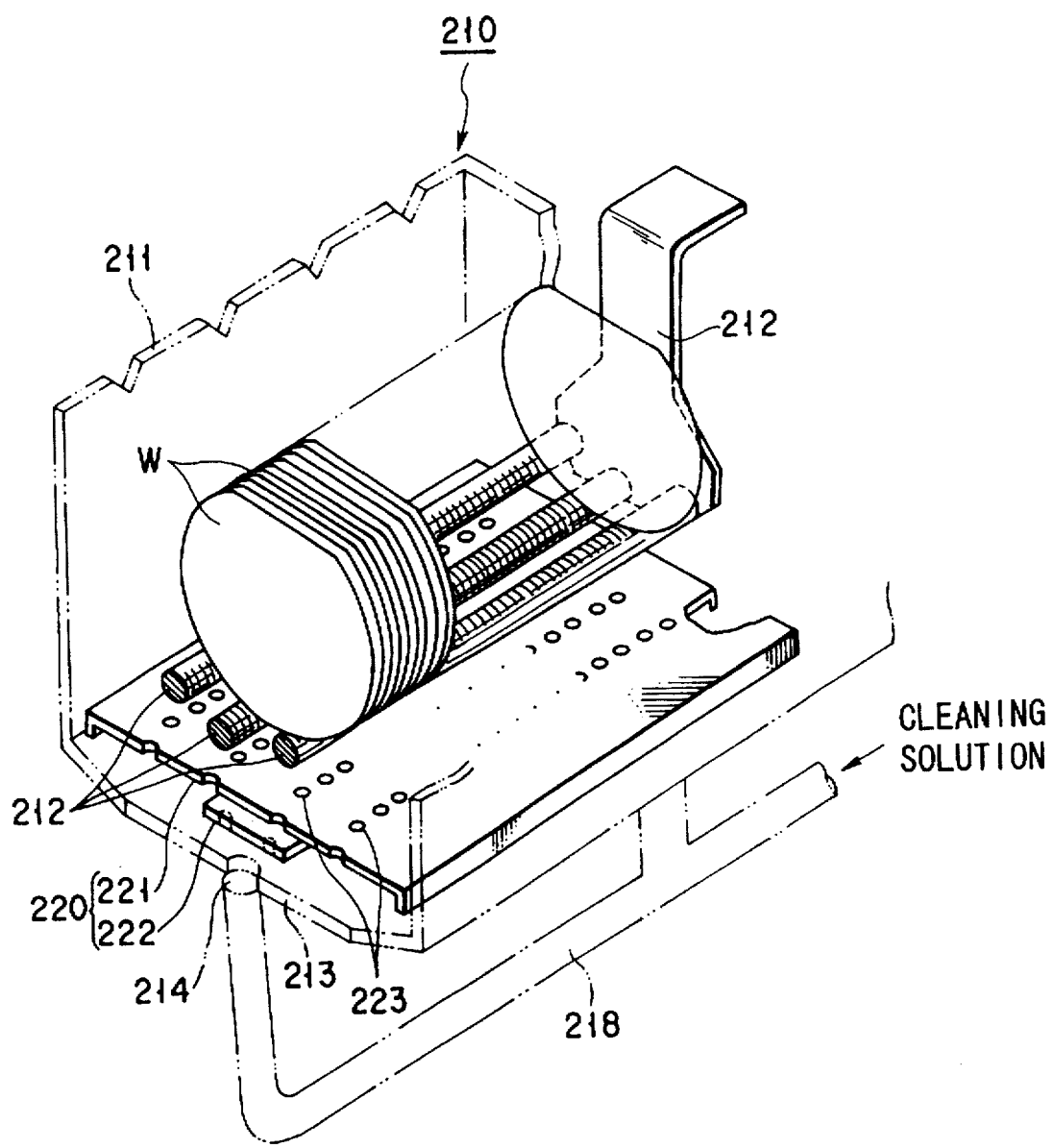
FIG. 4 is a perspective view of part of the cleaning bath of the cleaning machine shown in FIG. 1.
Figure 5:
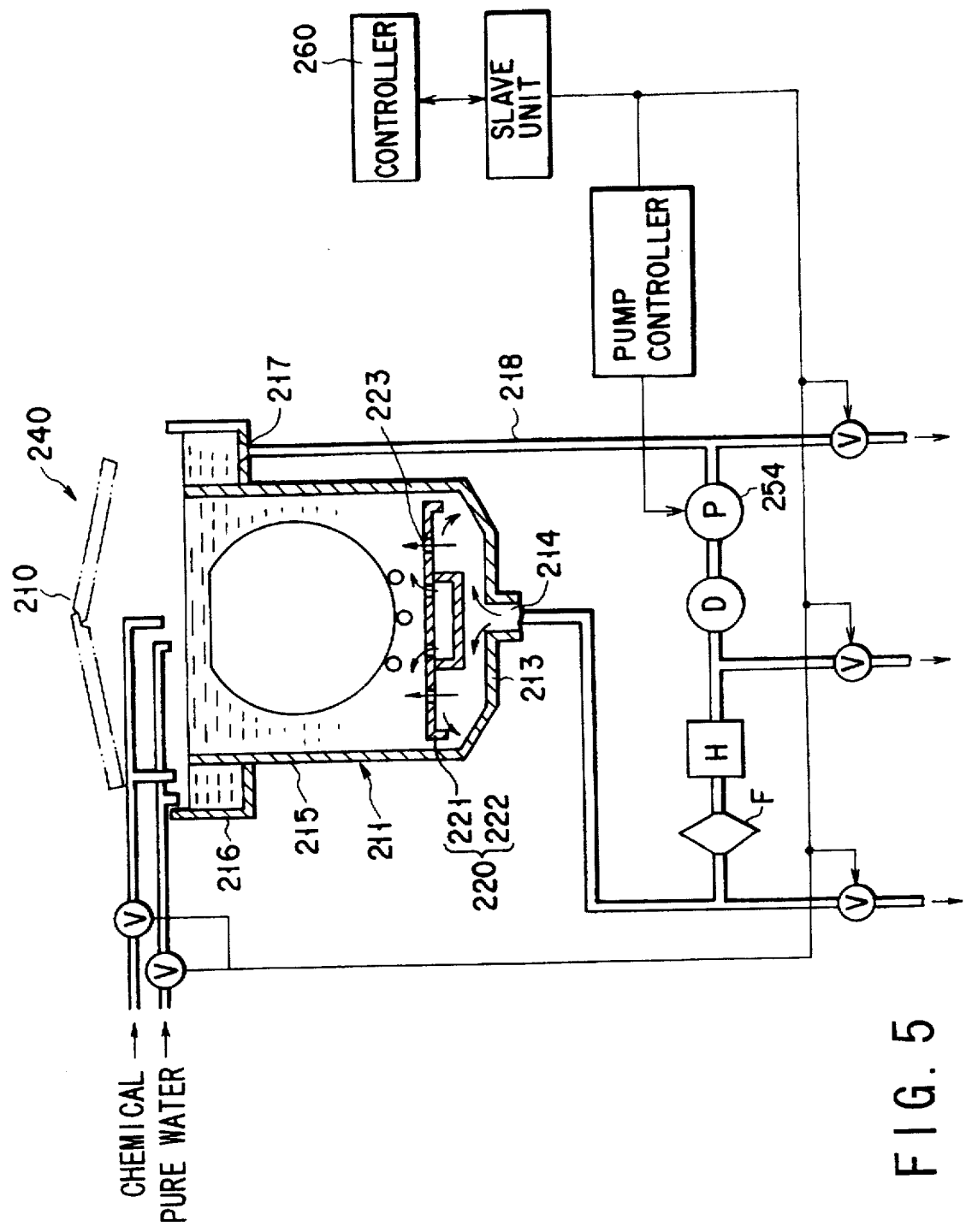
FIG. 5 is a schematic sectional view of the cleaning bath shown in FIG. 4.

As shown in FIGS. 4 and 5, the processing bath section 210 has a box-shaped processing bath 211 and a wafer holder 212. The processing bath 211 stores an SC1 cleaning chemical heated to a high temperature and consisting of a solution mixture of ammonia water and hydrogen peroxide water. The wafer holder 212 is disposed in the processing bath 211 to hold, e.g., 50 wafers W vertically. A supply port 214 for the cleaning chemical is formed in a bottom portion 213 of the processing bath 211. The cleaning solution introduced into the processing bath 211 through the supply port 214 is uniformly supplied to around the wafers W by a rectifier 220 interposed between the wafer holder 212 and the bottom portion 213 without causing turbulence.

More specifically, the rectifier 220 is constituted by a rectifying board 221 disposed horizontally to vertically divide the processing bath 211, and a diffusion disk 222 arranged above the supply port 214. A large number of pores 223 are formed in the rectifying board 221. The chemical introduced through the supply port 214 collides against the lower surface of the diffusion disk 222, is diffused to the entire lower surface of the rectifying board 221 via the peripheral portion of the diffusion disk 222, passes through the pores 223 of the rectifying board 221, and is supplied to around the wafers W held by the wafer holder 212. Accordingly, the chemical surrounds the wafers W at a uniform flow rate without causing a turbulence to uniformly clean the entire wafers W. The processing bath 211 is constituted by an inner bath 215 and an outer bath 216. The inner bath 215 stores the wafer holder 212 to allow dipping of the wafers W in the processing solution. The outer bath 216 receives the processing solution which overflows from the upper end of the inner bath 215. A chemical circulation loop 218 is connected between the supply port 214 formed in the bottom portion 213 of the inner bath 215 and a discharge port 217 formed in the bottom portion of the outer bath 216. A circulating pump P, a damper D, a heater H, and a filter F are connected to the chemical solution circulation loop 218. The chemical overflowing from the inner bath 215 to the outer bath 216 is cleaned through the damper D, the heater H, and the filter F, and is circulated to the inner bath 215.

An openable/closable cover 240 is attached to the upper opening portion of the processing bath 211. When the cover 240 is closed, the processing solution gasified during processing can be prevented from being diffused, and contaminants and dust are prevented from mixing into the cleaning bath section 210 from the outside.

The cleaning section 200 has the above arrangement. The unloader section 300 is provided downstream the cleaning section 200 to return wafers W that have undergone cleaning to the carrier C and unload them to outside the cleaning machine. The basic arrangement of the unloader section 300 is identical to that of the loader section 100, and the processed wafers W can be unloaded to outside the cleaning machine by performing the steps performed by the loader section 100 in the reverse order. Therefore, a detailed description of the basic arrangement of the unloader section 300 will be omitted. In other words, if the loader 100 is reversely driven, it can function as an unloader for transferring the processed wafers W to the outside of the cleaning machine. In this case, the unloader 300 can be omitted.

The operation of the cleaning machine 1 having the above arrangement will be described.

Carriers C1 and C2 each storing 25 non-processed wafers W are placed on the loading positions of the stations 112 (shown in FIG. 2) of the loader section 100 (shown in FIG. 1) with a transfer robot (not shown).

The moving mechanism 115 sequentially clamps the carriers C1 and C2 and sequentially moves them to the transfer positions of the stations 112 while performing orientation flat alignment. After the arms 121a and 121b of the conveyer machine 120 clamp the carriers C1 and C2 simultaneously at the transfer positions, the Z base 123 is moved to the relay section 130 in the X direction, the holders 133 and 135 of the relay section 130 are moved upward in the Z direction, and the wafers W in the carriers C1 and C2 are transferred onto the holders 133 and 135.

Then, the wafer transfer machine 140a shown in FIG. 1 moves to the relay section 130 to clamp the aligned wafers W in units of lots with the wafer chuck 142 shown in FIG. 3, transfers the wafers W to an SC1 cleaning bath 202a of the first-stage cleaning unit 201a, and conveys them in units of lots to the wafer holder 212 provided in advance in the processing solution of the processing bath 211 shown in FIG. 4. After a predetermined SC1 cleaning is subjected to the wafers W, the wafers W are removed from the processing bath 211 by the wafer chuck 142, transferred to a first-stage water bath 203a, and conveyed to the wafer holder 212 provided in the first-stage water bath 203a to be subjected to first-stage cleaning with pure water.

Thereafter, the wafers W cleaned with pure water are sent to a second-stage water bath 204a (shown in FIG. 1) in the same manner to be subjected to second-stage cleaning with pure water. The chemical attaching to the wafers W is completely cleaned. The second-stage water bath 204a is also called an interface bath, is arranged between the previous chemical cleaning unit and a cleaning unit that performs cleaning with a different type of chemical, and has a function of a buffer for preventing the two chemicals from mixing. In the case shown in FIG. 1, the wafers W that have undergone SC1 cleaning in the chemical cleaning bath 202a are cleaned with water, and are set in the stand-by state as required in the second-stage water bath 204a serving as the interface bath for the purpose of HF cleaning with the second-stage cleaning unit 201a of the subsequent step.

The wafers W are removed from the second-stage water bath 204a of the first-stage cleaning unit 201a with a second-stage wafer transfer machine 140b that covers the second-stage cleaning unit 201b, and are transferred to an HF chemical bath 202b of the second-stage cleaning unit 201b for HF cleaning. After undergoing predetermined chemical processing, the wafers W are subjected to first-stage cleaning in a first-stage water bath 203b, and await for the cleaning operation of the subsequent step in a second-stage water bath 204b provided as the second interface bath. SC2 cleaning and other necessary cleaning operations are performed by repeating steps identical to those described above. Subsequently, the wafers W are sent to the final water bath 205 with the n-stage wafer transfer machine 140n to be subjected to final water cleaning with pure water, and are sent to the drying bath 206 to be subjected to vapor drying with, e.g., IPA. The dried wafers are unloaded to outside the machine through the unloader section 300.

Figure 7:
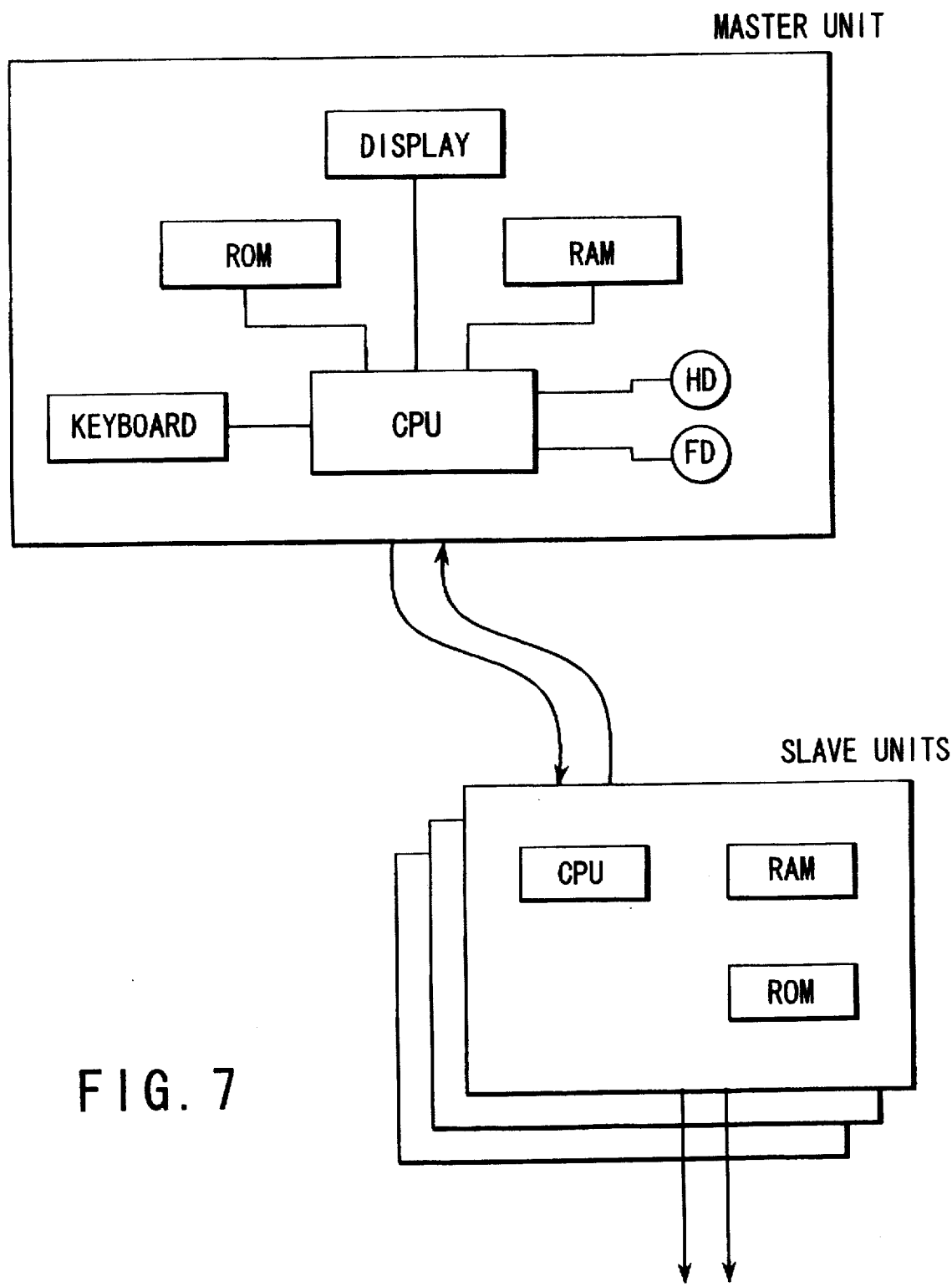
FIG. 7 is a schematic block diagram of the master unit and slave units of the cleaning machine.

The steps of cleaning a certain lot of wafers with the cleaning machine 1 to which the present invention can be applied are described above. In general, the processing steps as described above are performed in accordance with a processing recipe preset and input in a controller 260 in advance. The controller 260 comprises a personal computer or a workstation having an operator display 261 and an input unit 262, e.g., a keyboard and a mouse, as shown in FIG. 1, and schematically has a hardware architecture like a master unit having a CPU, a ROM, a RAM, a KEYBOARD, a DISPLAY, a hard disk (HD), a floppy disk (FD), and the like, as shown in FIG. 7. The slave units shown in FIG. 7 are respectively attached to the various types of devices incorporated in the cleaning machine shown in FIG. 1.

When the operator inputs a predetermined instruction to the controller 260 in accordance with the operation screen described hereinbelow, the controller 260 can control the cleaning machine in the manual or auto mode.

Figure 8:
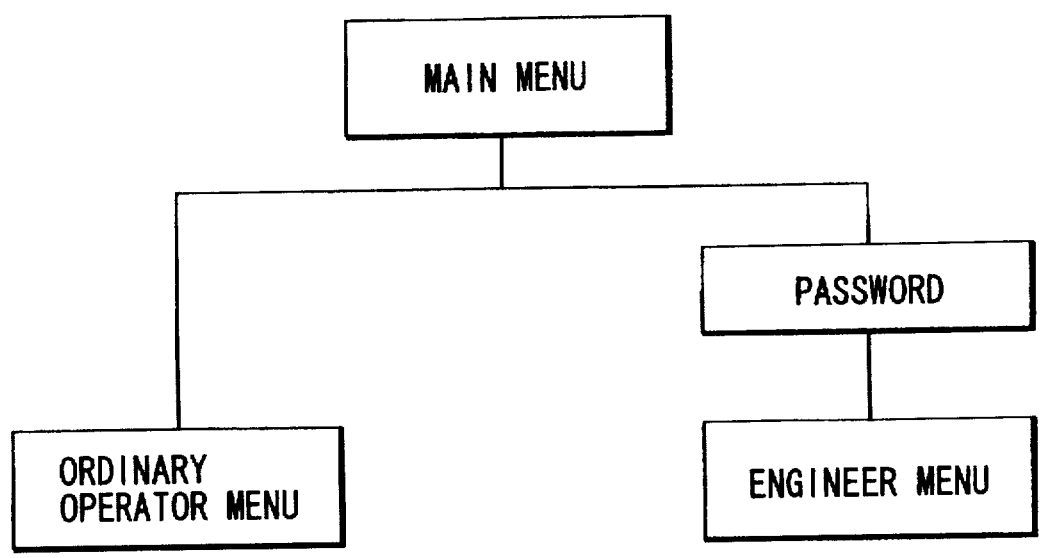
FIG. 8 shows the first hierarchical system indicating the hierarchical structure of the operator screen which is employed based on the present invention.
Figure 9:
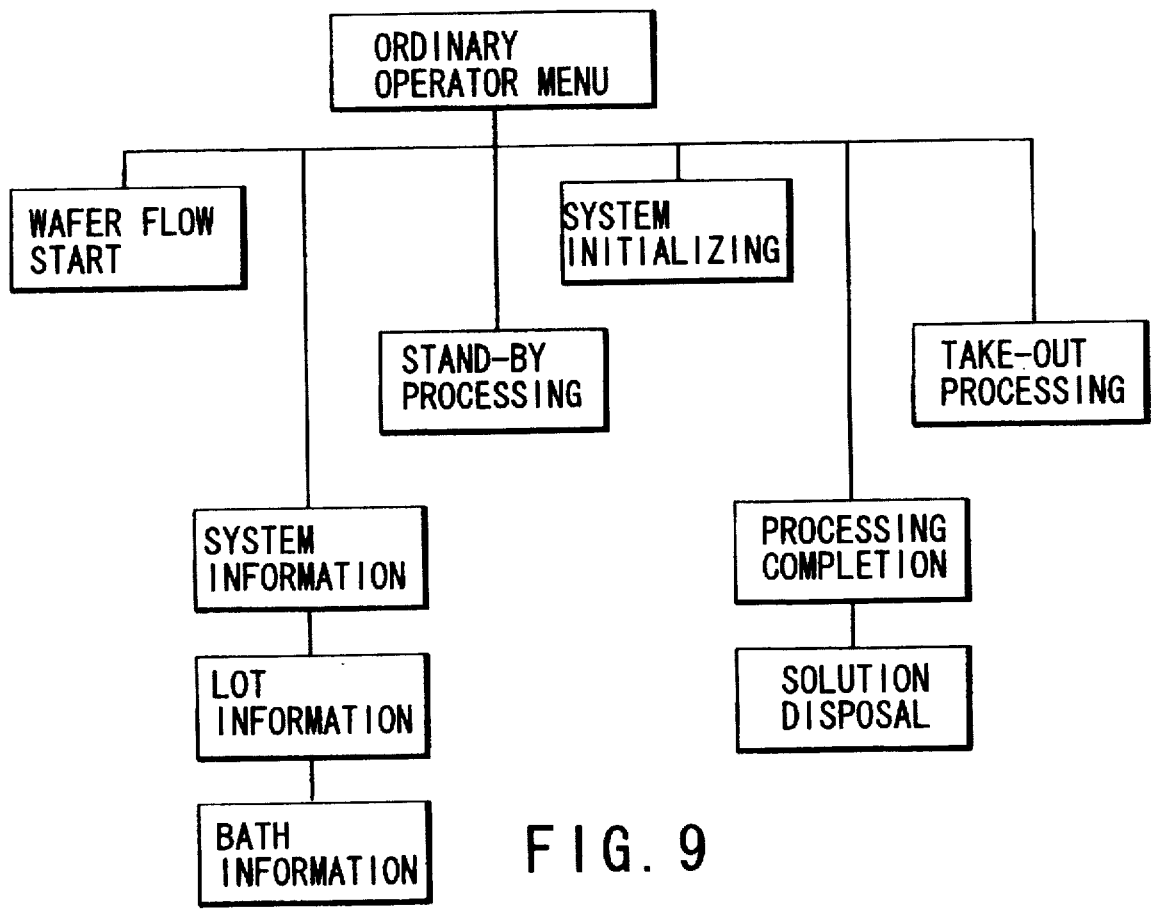
FIG. 9 shows the second hierarchical system indicating the hierarchical structure of the operator screen which is employed based on the present invention.
Figure 10:
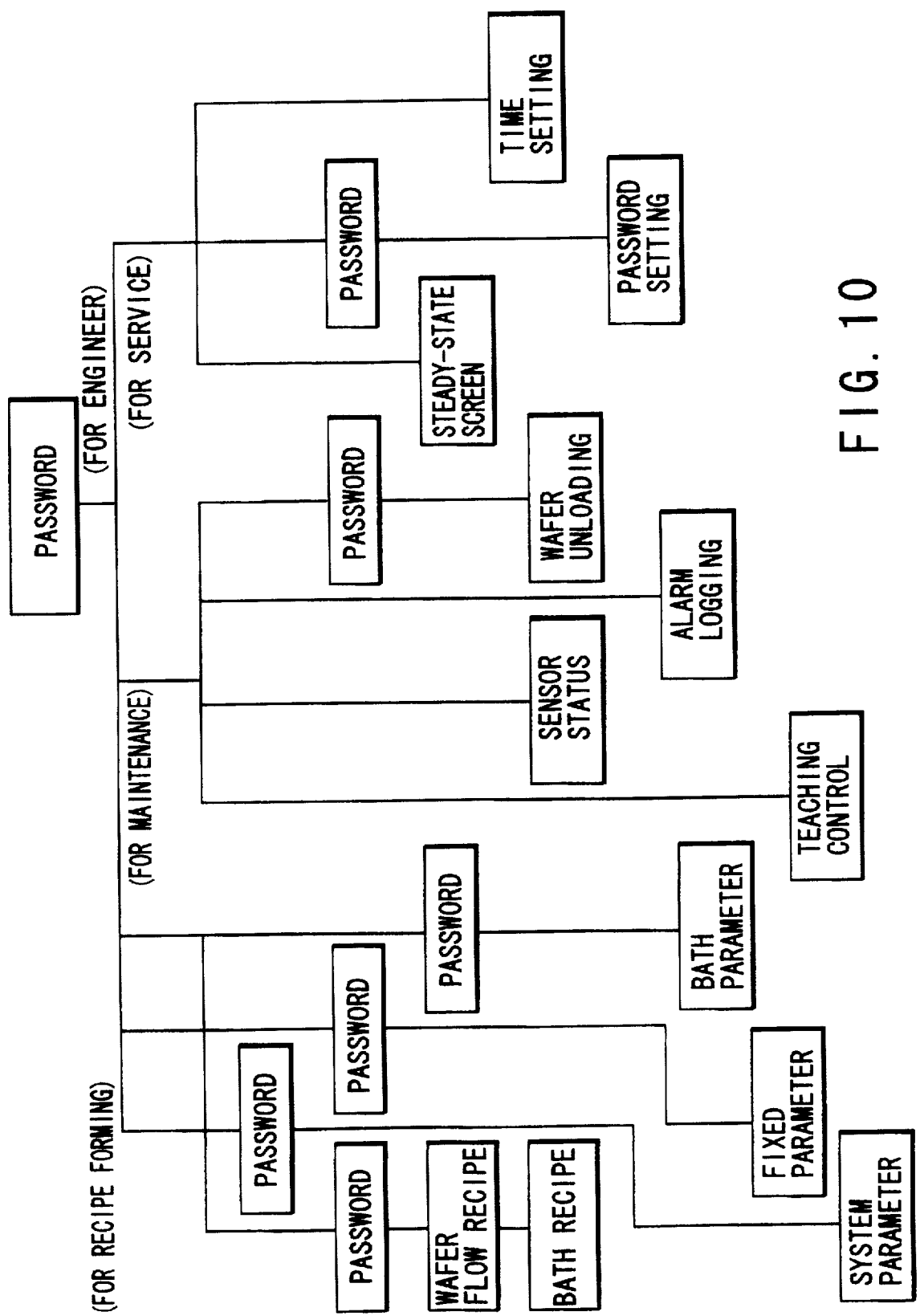
FIG. 10 shows the third hierarchical system indicating the hierarchical structure of the operator screen which is employed based on the present invention.

FIGS. 8 to 10 show the hierarchical systems of a screen control system to which the present invention can be applied. As shown in FIG. 8, the main menu is divided into an ordinary operator menu and an expert operator menu, e.g., an engineer menu. The ordinary operator menu includes, a wafer flow start, a system information, a stand-by processing including commands for initializing the respective baths, a system initializing including a command for initializing the transfer system, a processing completion menu, and a take-out processing as shown in FIG. 9. The engineer menu (expert operator menu) includes a recipe forming, a maintenance, and a service as shown in FIG. 10.

In the recipe forming, a wafer flow recipe, a system parameter, a fixed parameter, and a bath parameter can be selected. In the maintenance, a teaching control, a sensor status, and an alarm logging can be selected. In the service, a steady-state screen, a password setting, and a time setting can be selected.

Figure 11:
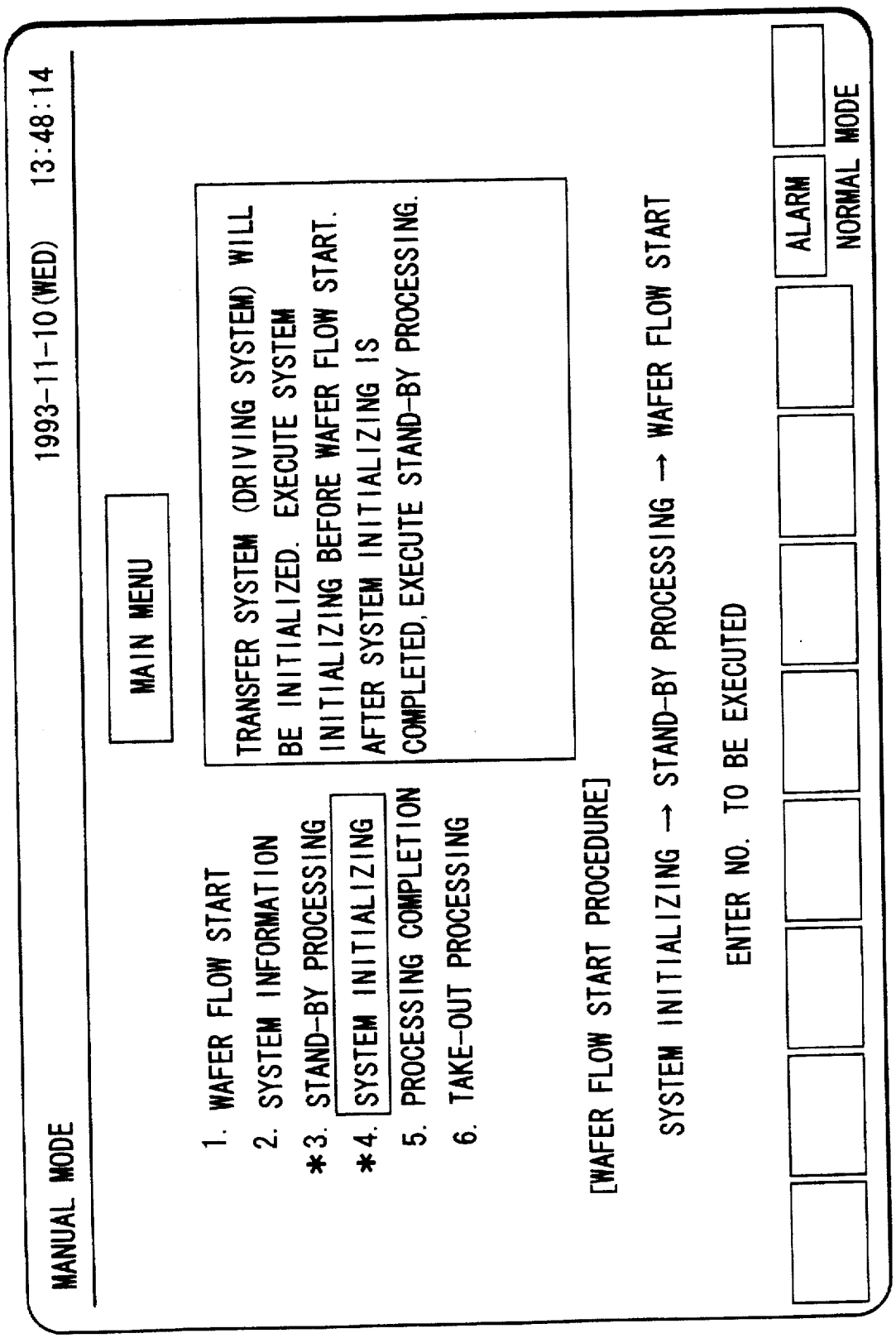
FIG. 11 shows a menu obtained upon selection of a machine initializing from a main menu.
Figure 23B:
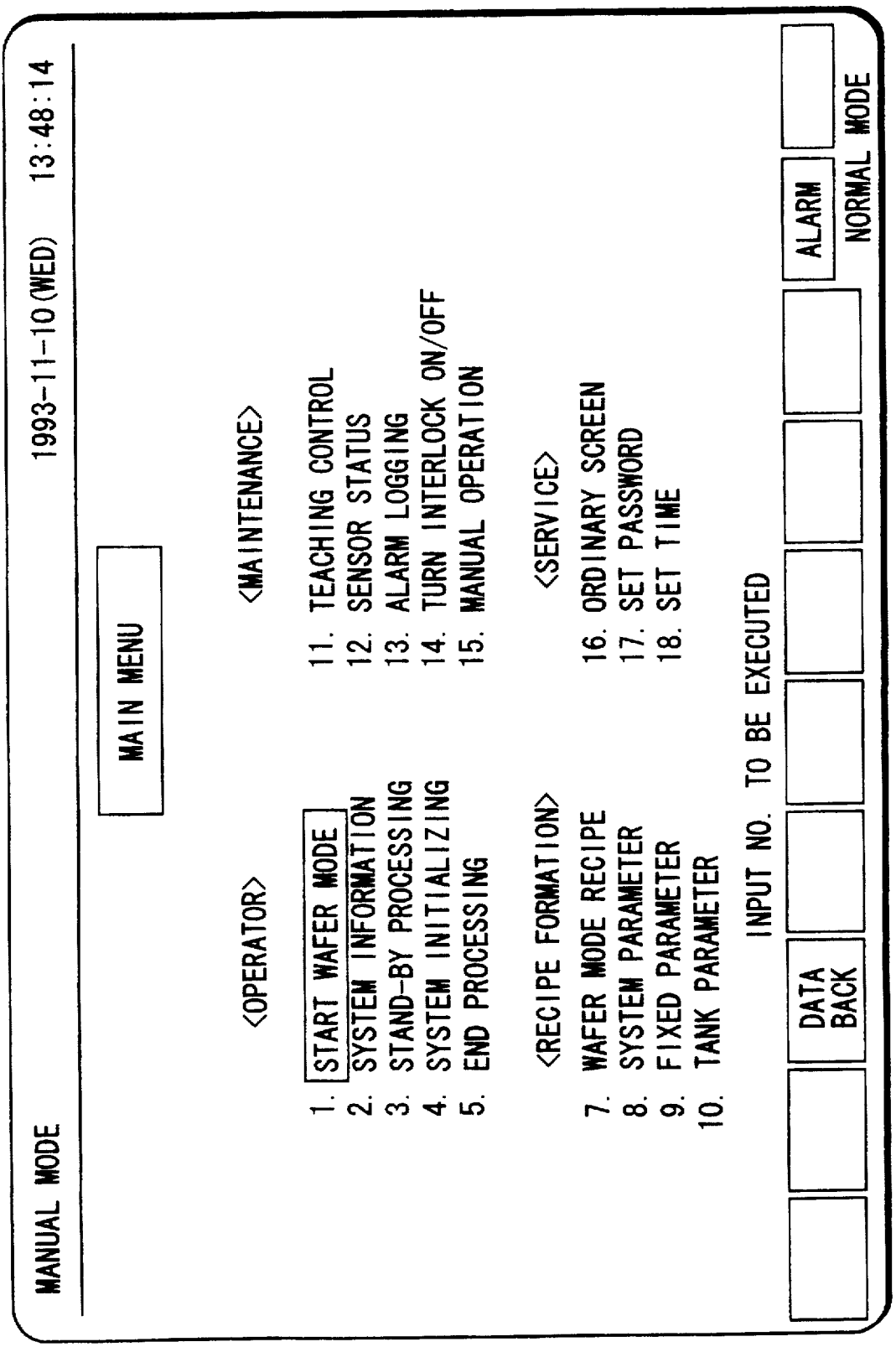
FIG. 23B shows a main menu displayed by input of the password.
Figure 24:
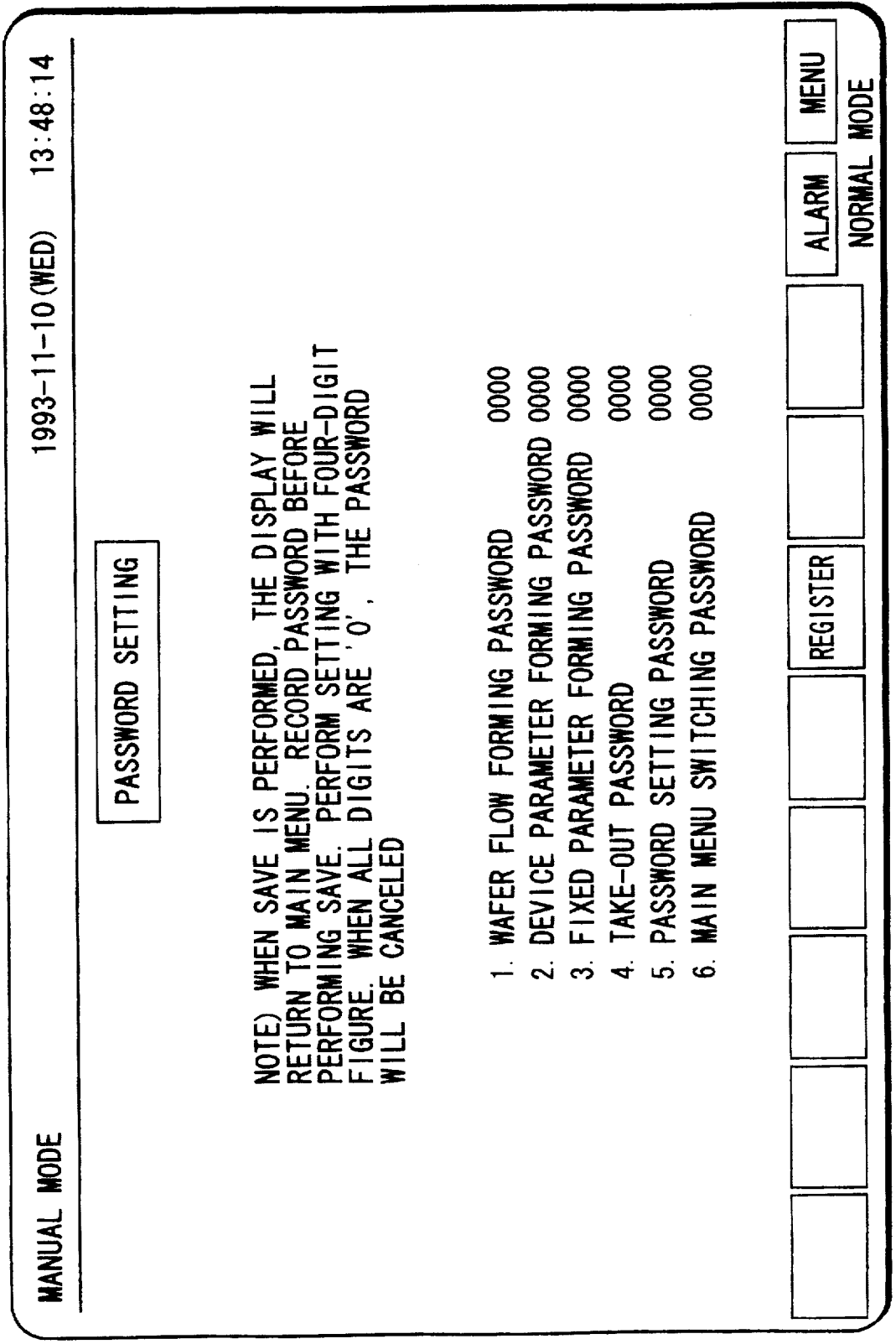
FIG. 24 is an explanatory view showing the password setting of a service menu.

According to the present invention, after power supply is turned on, only the ordinary operator menu is displayed as shown in FIG. 11. Accordingly, the ordinary operator does not notice the existence of the engineer menu. To display the engineer menu, since the password setting screen shown in FIG. 23 is displayed, only the operator who knows the password inputs it in the password setting screen through the keyboard. Then, the CPU compares the input password with the registered password. When the input password coincides with the registered password, a main menu as shown in FIG. 23B is displayed.

The above-described menu information is stored in the hard disk of the master unit and is read out as required to be displayed on the display.

A case will be described wherein the ordinary operator is to execute a general cleaning operation based on the screen control system having the above arrangement.

When the ordinary operator turns on the power supply, a main menu as shown in FIG. 11 which includes a wafer flow start, a system information, a stand-by processing, a system initializing, a processing completion, and a take-out processing and which can be accessed by the ordinary operator not having the expert knowledge is read out from the hard disk and displayed on the operator display 261. When the ordinary operator selects the system initializing menu in this main menu as shown in FIG. 11, the master unit inquires of the slave units as to whether wafers exist in the cleaning machine. When the operator confirms the presence of wafers from the menu, the controller 260 controls the respective units of the cleaning machine by restoring the transfer system of the machine, e.g., the conveyer machine 120 of the loader section 100, the wafer transfer machine 140 of each cleaning unit 201, and the like to the initial positions, so that a new lot can be accepted.

Figure 12:
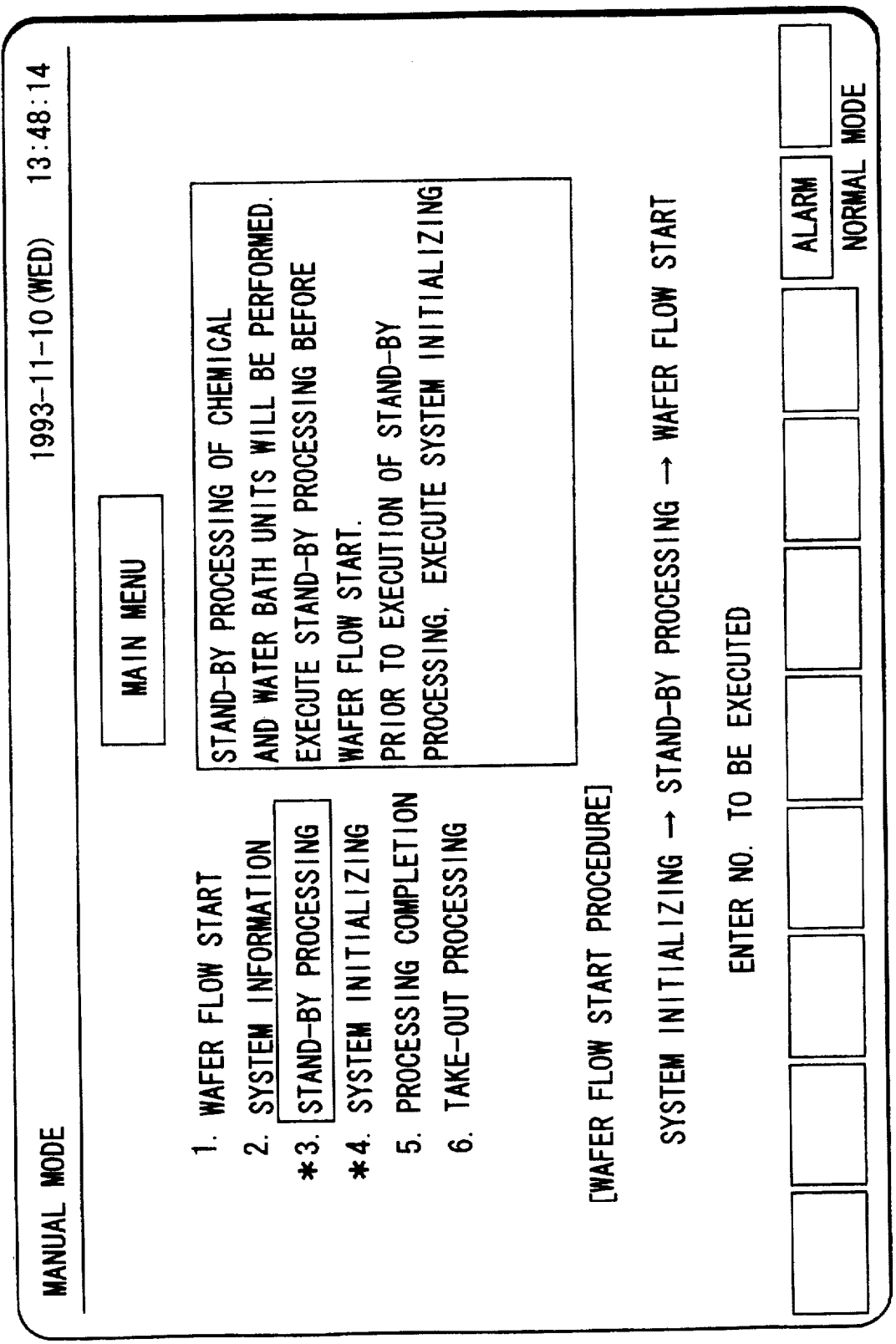
FIG. 12 shows a menu screen obtained upon selection of a stand-by processing from the main menu.
Figure 13:
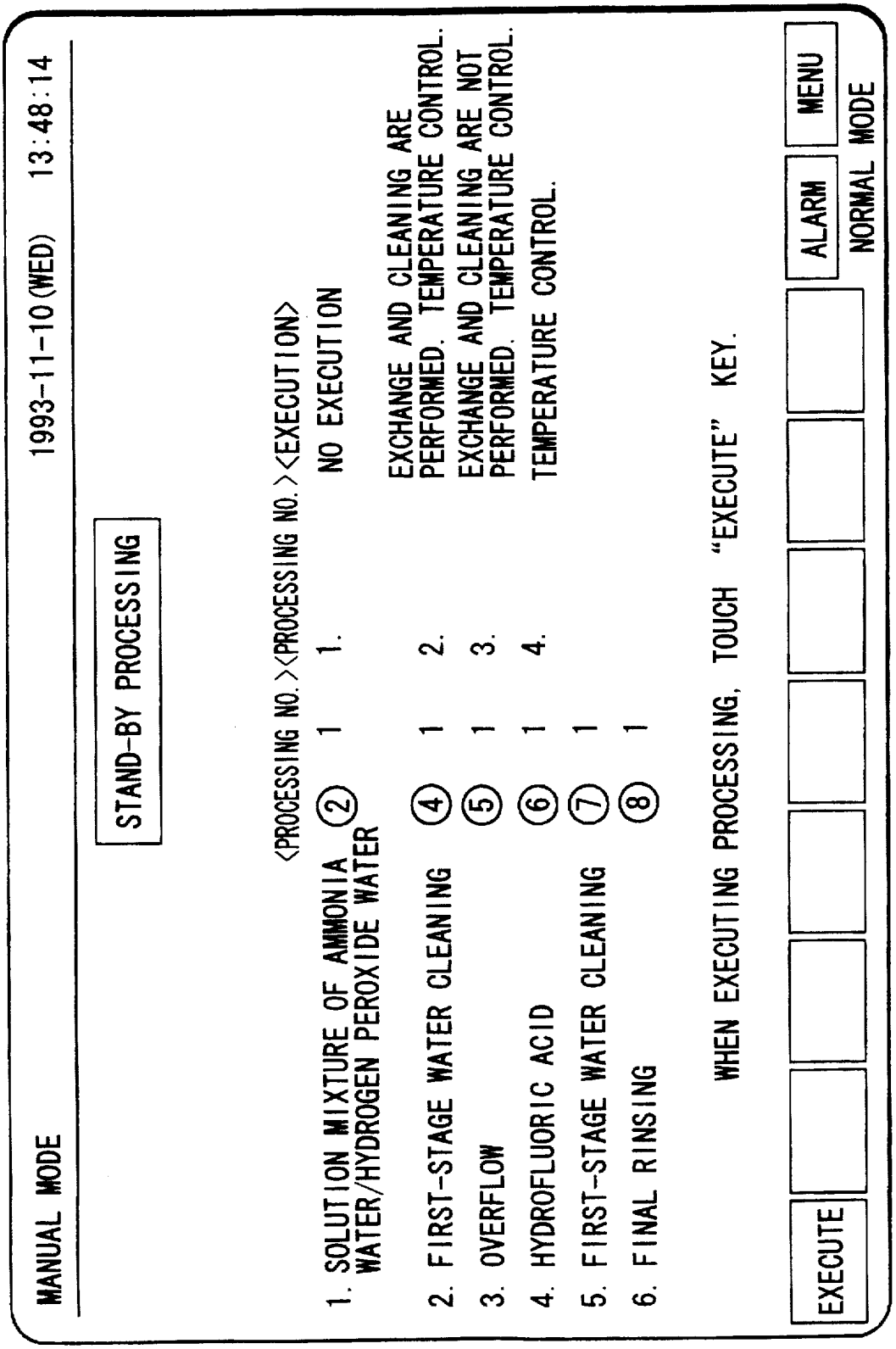
FIG. 13 shows a stand-by processing menu.

Thereafter, when the operator selects the standby, as shown in FIG. 12, a processing table as shown in FIG. 13 is displayed. Then, the controller 260 sets the entire cleaning machine in the stand-by state by injecting/exchanging predetermined chemicals or pure water in the respective processing baths and adjusting the chemicals or pure water to predetermined temperatures, so that cleaning can be started any time.

Figure 14:
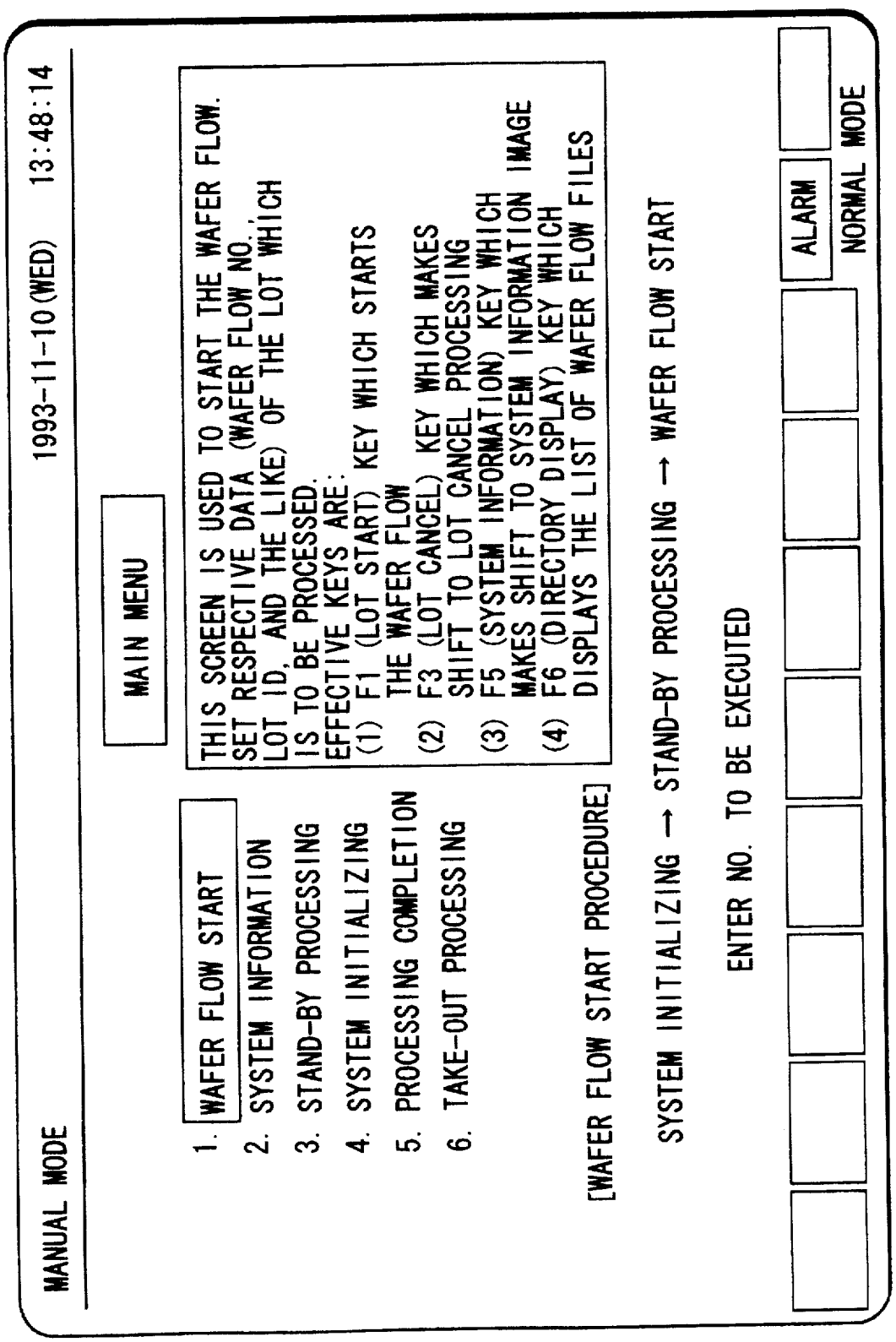
FIG. 14 shows a menu obtained upon selection of a wafer flow start from the main menu.

As described above, in this embodiment, the wafer flow start can be selected as shown in FIG. 14 only after system initializing and stand-by processing are executed. In this embodiment, an input concerning the wafer flow start can be accepted only after whether the system initializing and stand-by processing are executed or not are discriminated from a mark * and the mark * is deleted upon executing the respective processing operations. The wafer flow start is selected in this manner, and the lot ID of the wafer and the respective processing recipes are confirmed on the screen shown in FIG. 15. Thereafter, upon touching a lot start key, an ordinary cleaning operation as described above is started in the auto mode. After a series of cleaning operations are completed, the processed lot is automatically unloaded from the unloader section 300 to outside the machine by the transfer robot.

Figure 16:
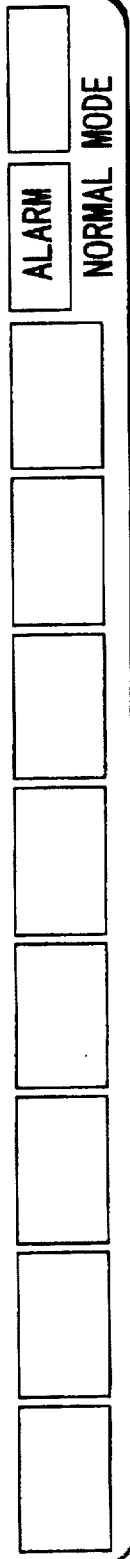
FIG. 16 shows a menu obtained upon selection of a processing completion from the main menu.

To stop the cleaning machine 1, a processing completion is selected in FIG. 16. When necessary, the chemicals and pure water in the respective processing baths are disposed or discharged, and thereafter the cleaning machine 1 is stopped.

Figure 17:
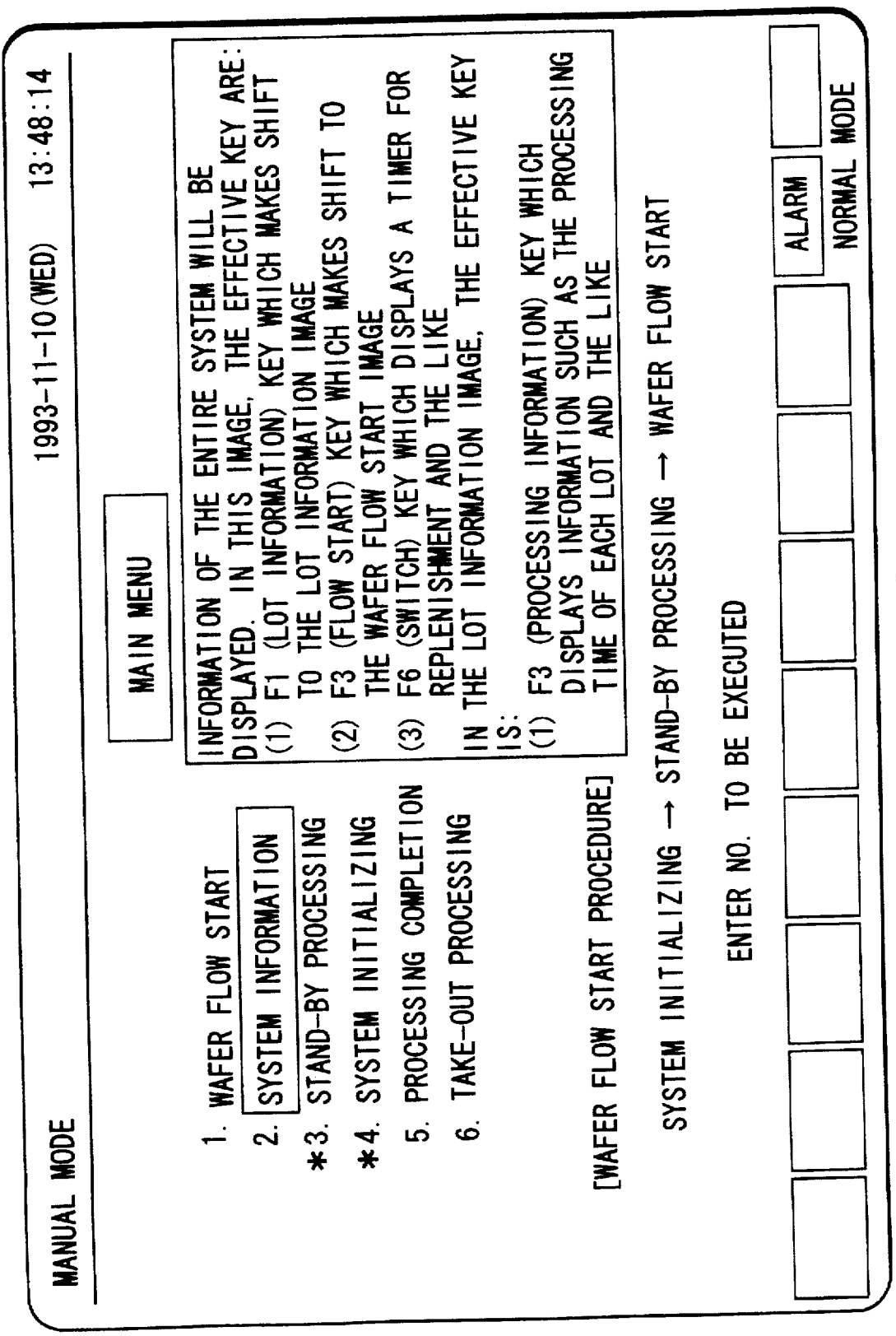
FIG. 17 shows a menu obtained upon selection of a system information from the main menu.

Of the ordinary operator menu, as shown in FIG. 17, the system information menu is used for displaying information concerning the respective units, e.g., the chemical baths and water bath that constitute the cleaning machine 1, the processing recipe, the lot information, and the like on the screen and confirming these information. This device information menu can be constituted by fixed information which is fixedly displayed by the cleaning machine and user information that can be selected by the user among item information of the cleaning machine.

The fixed information can be constituted by:

"total time" indicating the time that has elapsed since the power supply is turned on;

"manufacturing time" indicating the time of the wafer flow;

"manufacture availability" indicating the proportion of time (manufacturing time/total time) during which wafer flow is being performed since the power supply is turned on;

"machine name" indicating the name of the machine;

"display mode" indicating the display mode of the system information:

"arm information" indicating the current arm position and presence/absence of wafers;

"unit name" indicating the names of the respective units, e.g., the processing bath, that constitute the cleaning machine;

"processing information" indicating information on processing, e.g., cleaning, water cleaning, or the like, the unit is performing currently;

"wafer flow number" indicating the wafer flow number of the lot existing in the unit; and "lot ID" indicating the ID of the lot existing in the unit The user information can be constituted by:

"processing time" indicating the remaining time of processing, e.g., cleaning, immersion, and drying;

"preset processing time" indicating time preset concerning processing, e.g., cleaning, immersion, and drying;

"measured temperature/resistance" indicating the measured processing bath temperature of a chemical bath and a measured specific resistance of a water bath;

"preset temperature/resistance" indicating a preset processing bath temperature of a chemical bath and a preset specific resistance of a water bath;

"measured tank temperature" indicating the measured DIW tank temperature of the chemical;

"preset tank temperature" indicating the preset DIW tank temperature of the chemical;

"exchange time" indicating the exchange interval time of the chemical or IPA;

"preset exchange time" indicating the preset exchange interval time of the chemical or IPA;

"exchange count" indicating the exchange interval count of the chemical or IPA;

"preset exchange count" indicating the preset exchange interval count of the chemical or IPA;

"elapsed time" indicating the time elapsed after exchange of the chemical or IPA;

"elapsed count" indicating the count elapsed after exchange of the chemical or IPA;

"WAIT time" indicating the wait time between exchange of the chemical and lot loading;

"chemical replenish time" indicating the interval time of replenishment of the chemical;

"preset chemical replenish time" indicating the preset interval time of replenishment of the chemical;

"chemical replenish count" indicating the interval count of replenishment of the chemical;

"preset chemical replenish count" indicating the preset interval count of replenishment of the chemical;

"hydrogen peroxide water replenish time" indicating the interval time of replenishment of hydrogen peroxide water;

"preset hydrogen peroxide water replenish time" indicating the preset interval time of replenishment of hydrogen peroxide water;

"hydrogen peroxide water replenish count" indicating the interval count of replenishment of hydrogen peroxide water;

"preset hydrogen peroxide water replenish count" indicating the preset interval count of replenishment of hydrogen peroxide water;

"pure water replenish time" indicating the interval time of replenishment of pure water;

"preset pure water replenish time" indicating the preset interval time of replenishment of pure water;

"pure water replenish count" indicating the interval count of replenishment of pure water; and "preset pure water replenish count" indicating the preset interval count of replenishment of pure water.

Figure 19:
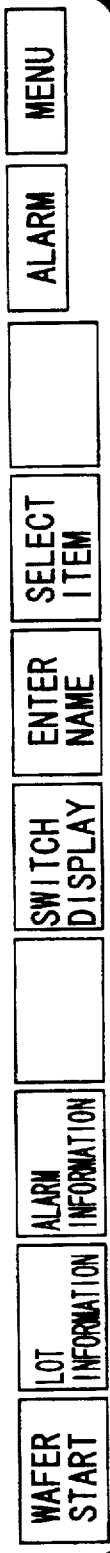
FIG. 19 shows a screen displaying information on the second device in the manual mode.

FIGS. 18 and 19 show typical system information. As shown in FIGS. 18 and 19, the system information formed based on the present invention displays fixed information and user information. More specifically, fixed information constituted by character strings including total time, manufacturing time, manufacture availability, machine name, and display mode; and a table including arm information, unit name, processing information, wafer flow number, and lot ID is displayed at the upper half of the screen. This fixed information is always displayed when the system information is displayed, as shown in FIGS. 18 and 19, regardless of the display mode and display screen.

Figure 20:
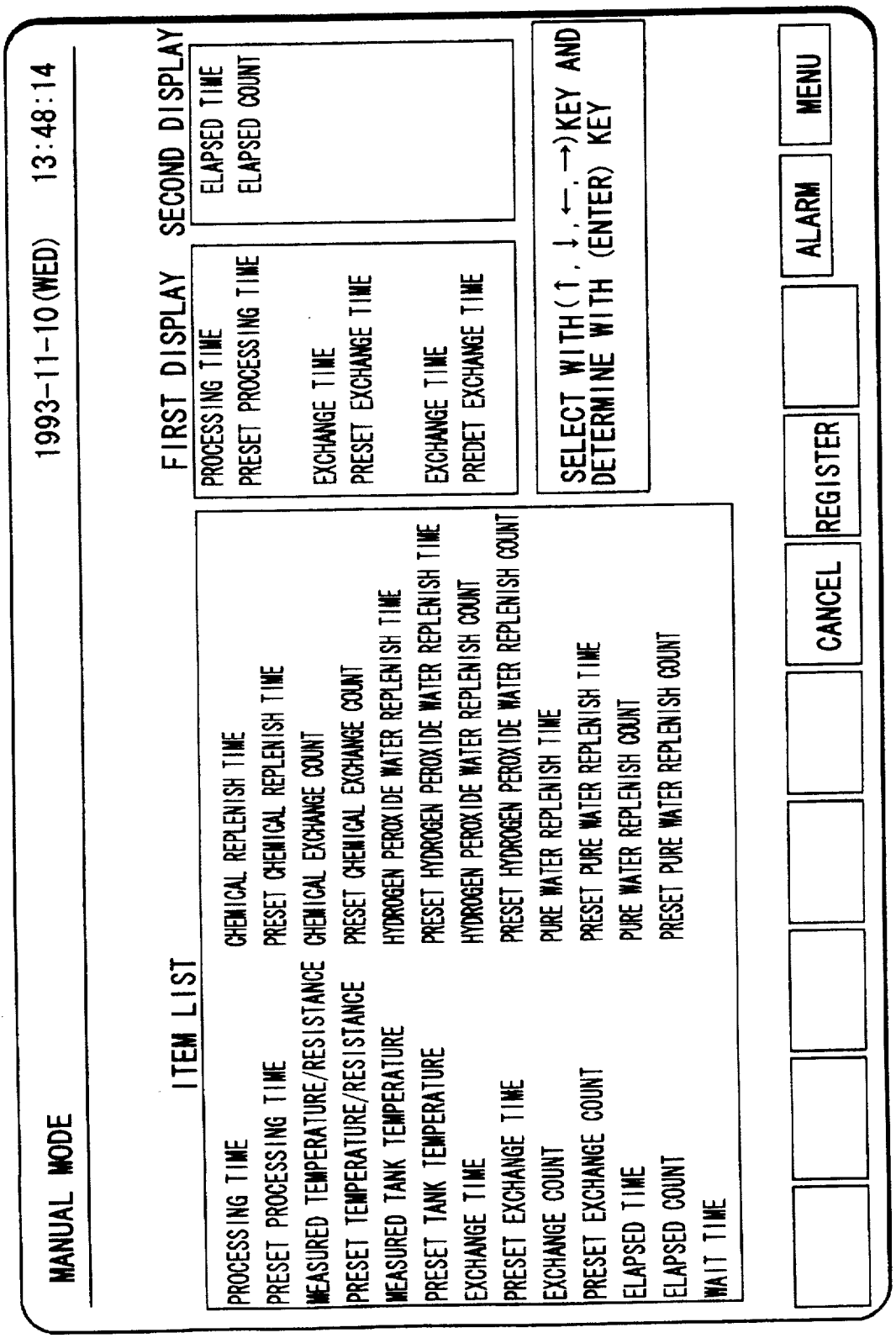
FIG. 20 shows a screen displaying information to be selected by the user.

User information constituted by processing time, preset processing time, exchange time, and preset exchange time is displayed at the lower half of the screen shown in FIG. 18, and user information constituted by elapsed time and elapsed count is displayed at the lower half of the screen shown in FIG. 19. Such user information are items selected in the user information selection screen shown in FIG. 20 so that they are displayed on the system information based on the present invention. In FIG. 20, the processing time, preset processing time, exchange time, preset exchange time, exchange count, and preset exchange count are selected as items to be displayed on the first display, and the elapsed time and elapsed count are selected as items to be displayed on the second display. As a result, the display is formed such that desired items can be displayed on the screen shown in FIG. 18 which corresponds to the first display and on the screen shown in FIG. 19 which corresponds to the second display.

As described above, according to the present invention, in addition to the fixed information, the user information can be displayed upon arbitrary selection of the user. Thus, an optimum system information can be formed in accordance with the processing conditions, the processing environment, and the type of operator, thereby improving the operability.

When the selected user information has a size of two frames or more, as shown in FIGS. 18 and 19, if, e.g., real time display is selected as the display mode, the user information can be sequentially displayed on the respective frames every 30 seconds, thereby attracting attention of the operator. Alternatively, if fixed display is selected as the display mode, information that needs confirmation with a higher priority can always be displayed and information that needs confirmation with a secondary higher priority may be displayed upon operating a display switch key.

According to the present invention, any frame displays fixed information that needs minimum confirmation. Thus, the operator can always confirm minimum necessary information.

Figure 21:
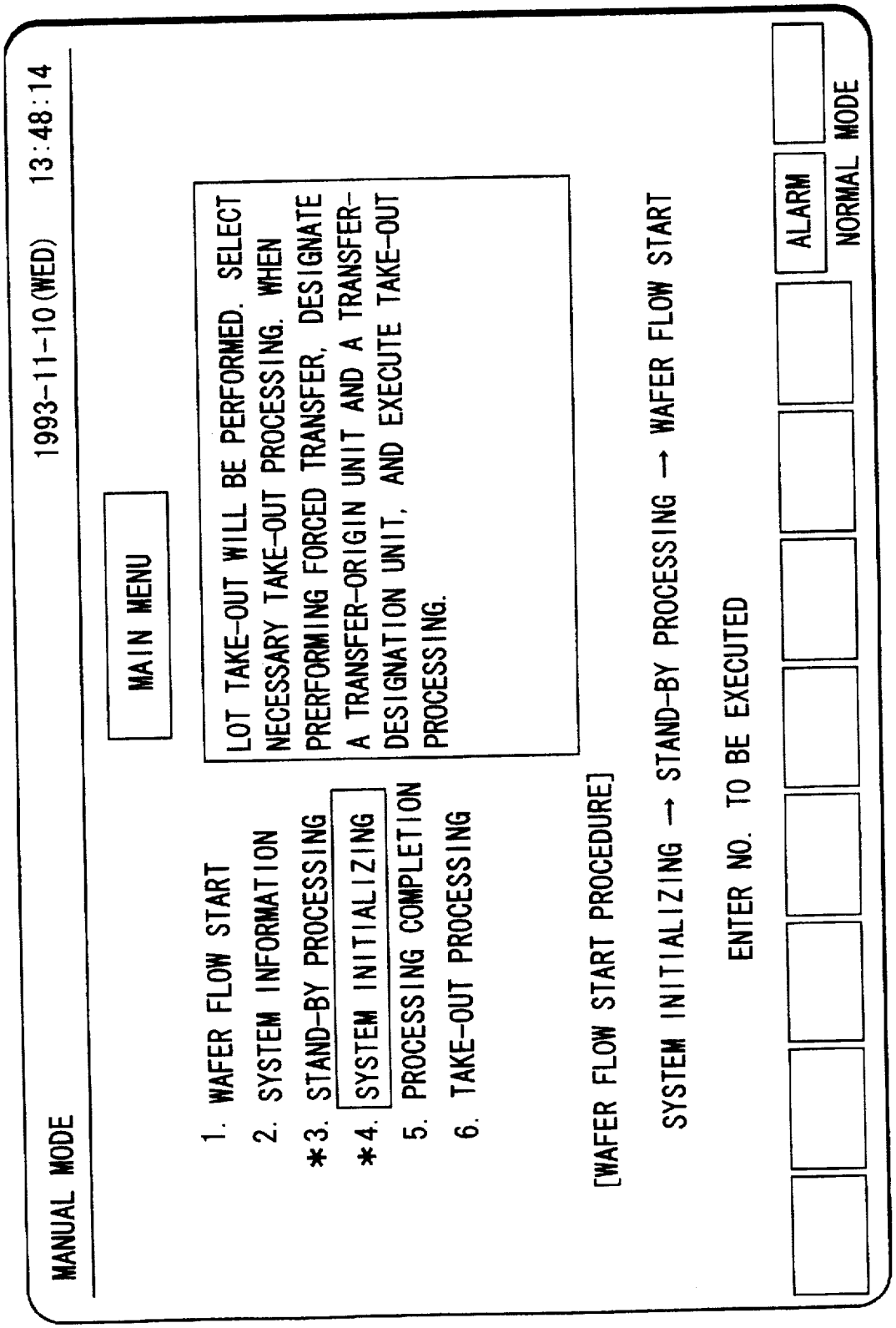
FIG. 21 shows a menu obtained upon selection of a take-out processing from the main menu.

The take-out processing menu shown in FIG. 21 is prepared in the ordinary operator menu. The take-out processing is required when a trouble occurs in any processing bath of the machine during processing, and is used for forcibly taking out wafers from the processing bath where the trouble has occurred to the downstream water bath and when necessary, using a screen as shown in FIG. 22, generating an instruction to forcibly unload such wafers after final cleaning and/or drying.

Figure 25:
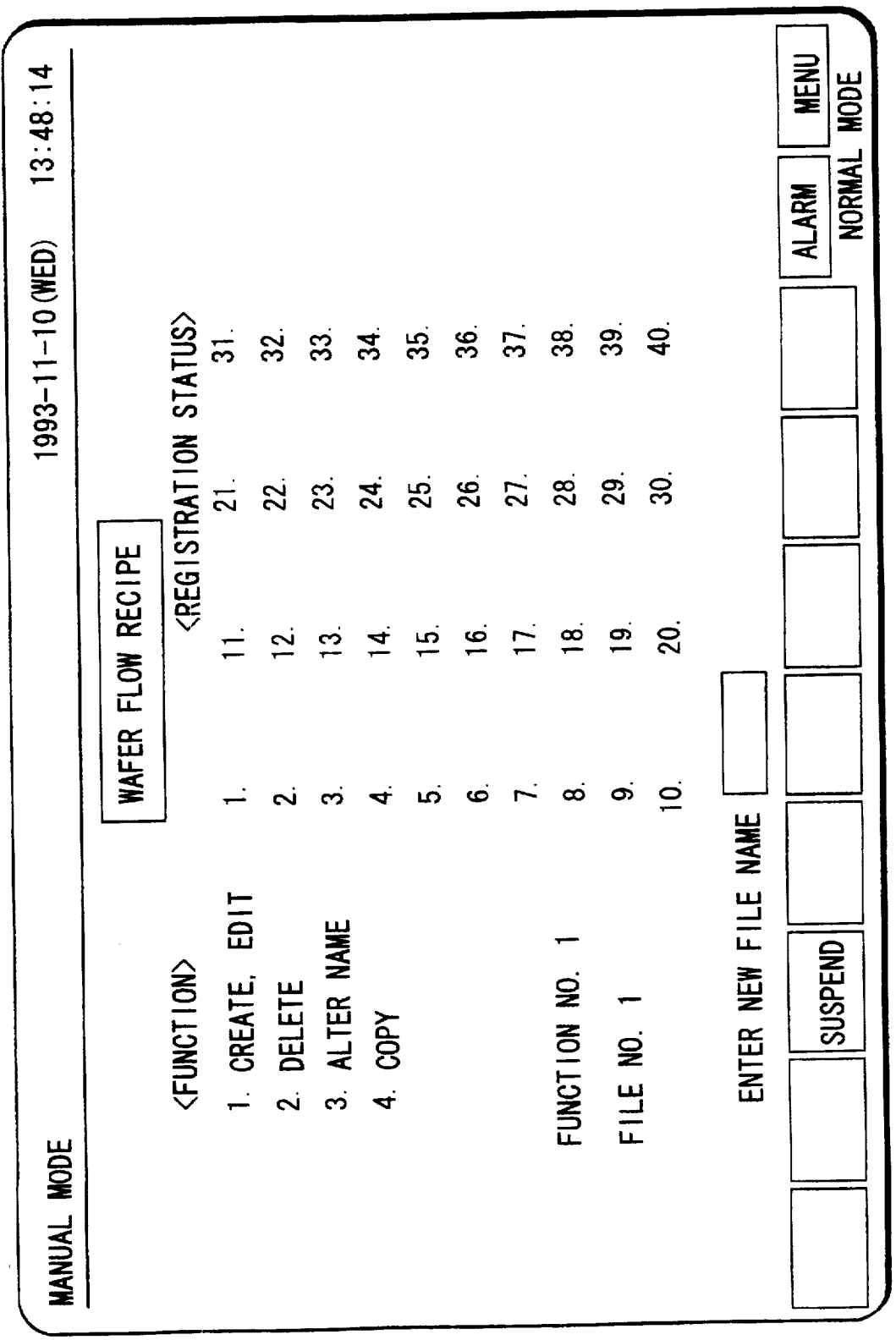
FIG. 25 shows a wafer flow recipe screen.

So far the ordinary operator menu used for performing cleaning in accordance with the preset processing flow has been schematically described. To newly set or correct the processing flow preset in the cleaning machine, in the main menu displayed after the power supply is turned on, after a password input screen is displayed as shown in FIG. 23A, the first password is input to the system. When the input password coincides with the registered password, the main menu as shown in FIG. 23B is displayed. Also, in a case of making the wafer flow recipe as shown in FIG. 25 display, the second password is input to the system after the password input screen is displayed as shown in FIG. 23A. When the input password coincides with the registered password, the main menu as shown in FIG. 23B is displayed. In other words, according to the present invention, a password that allows access to a menu used for setting and changing a certain parameter is taught to only an operator having a knowledge concerning this parameter. Thus, operators capable of accessing the engineer menu are further discriminated into those having a sufficient knowledge concerning the corresponding menu and those not having such a knowledge, so that the parameter in question can be protected.

In this manner, in this embodiment, a password is required to access a menu that requires an expert knowledge to be operated. Thus, the system is formed such that an expert operator (engineer) having the expert knowledge of this menu is discriminated from ordinary operators not having the expert knowledge of this menu in order to prevent unnecessary, careless, or intentional access to this menu, so that various types of parameters that significantly influence the operation of the system will not be altered or falsified. More specifically, as shown in FIGS. 8 to 10, to display the recipe forming screen, a password must be input. Only an engineer who knows the password, i.e., only those having a knowledge necessary for forming/changing the recipe can cause the wafer flow recipe, the system parameter, the fixed parameter, and the bath parameter to be displayed. Contents included in these menus should not be altered unnecessarily or carelessly. Thus, depending on the case, different passwords may be set for different menus, as shown in FIG. 10, so that the contents of the corresponding menus can be protected.

The wafer flow recipe shown in FIG. 25, access to which is allowed in this manner, is a menu necessary for creating a file in which a processing flow, i.e., the processing recipe, necessary for performing processing in accordance with the wafer flow start of the ordinary operator menu is recorded. In this embodiment, 40 files can be managed.

In the screen shown in FIG. 25, when a certain file is designated and "1. Create, edit" is selected, a table as shown in FIG. 26 indicating the respective processing units and corresponding processing operations can be displayed. In the respective parameters to be described later, if the processing conditions are preset and a detailed instruction in accordance with the processing recipe is not necessary, merely the processing time need be input in the screen shown in FIG. 26 to complete the table. If a detailed instruction in accordance with the processing recipe is necessary, the number of the processing recipe is input to complete the table.

Figure 27:
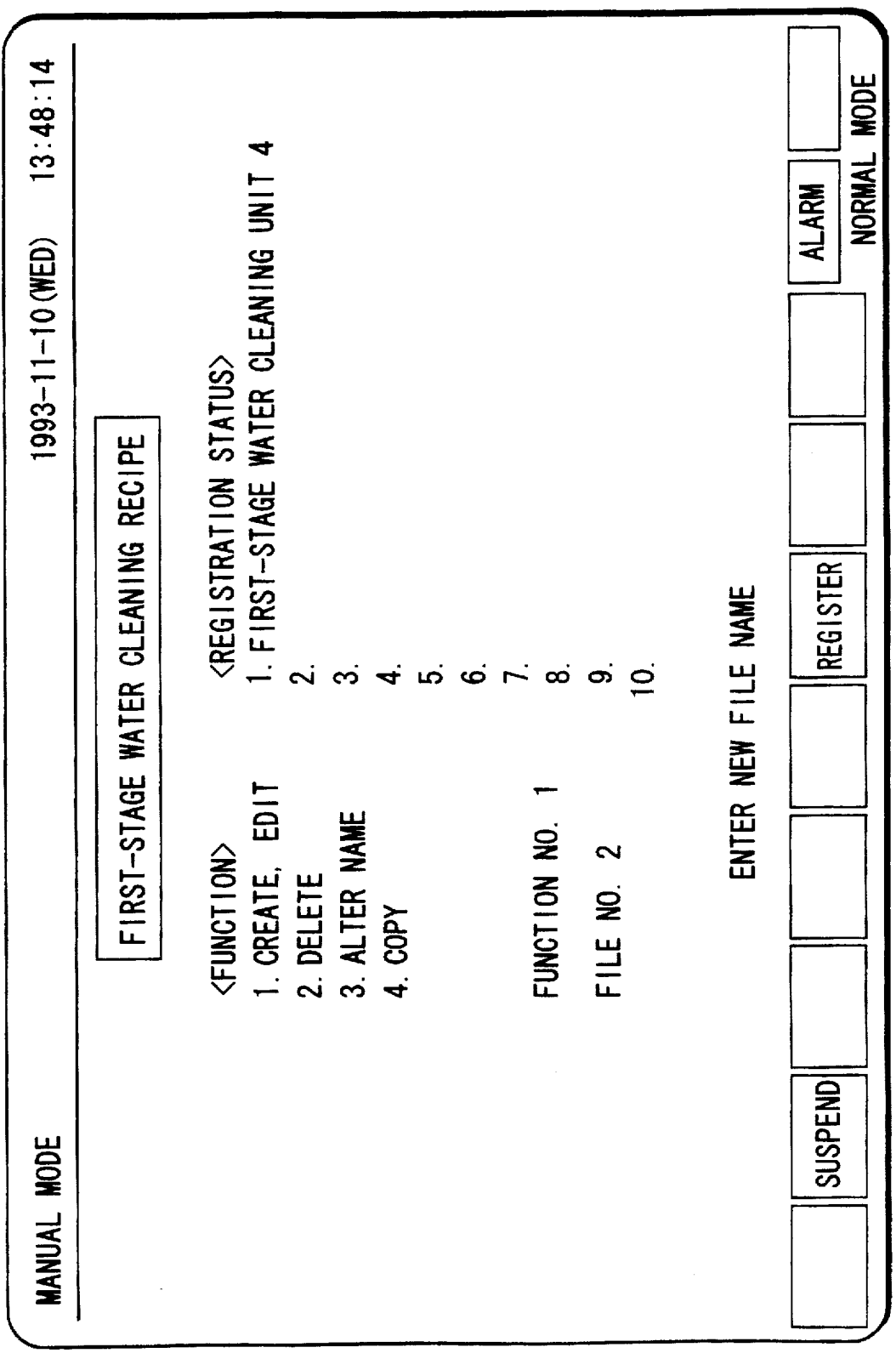
FIG. 27 shows the file selection menu of a first-stage water-cleaning recipe.
Figure 28:
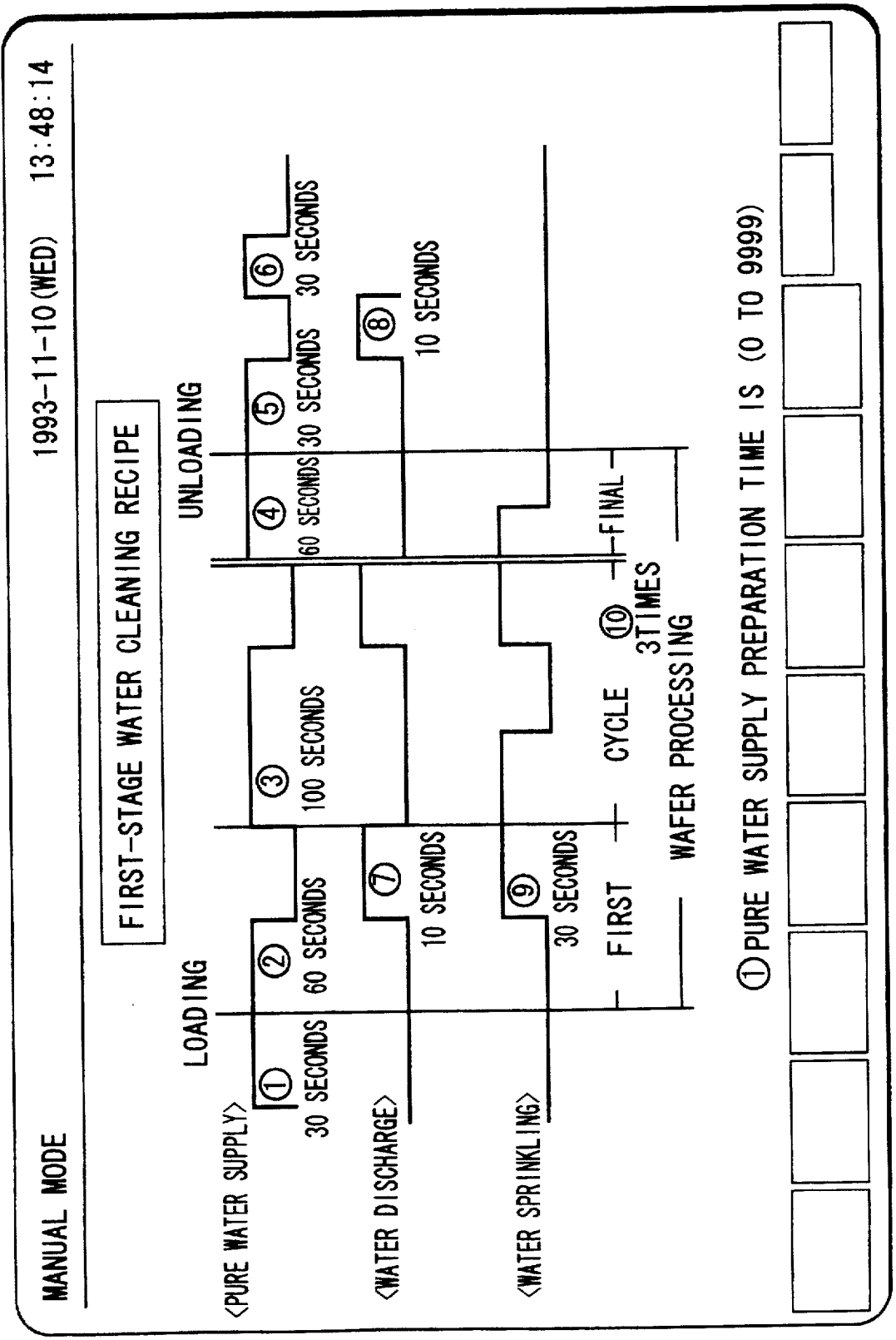
FIG. 28 shows the selection screen of the first-stage water-cleaning recipe.

If a processing recipe concerning each processing unit input to the table must be created or edited, a "recipe edit" key may be touched to display the list of the registered processing recipes, as shown in FIG. 27. Thereafter, if a processing recipe that executes formation/correction is selected, a recipe edit screen as shown in FIG. 28 can be displayed. In the following description, a method of processing the recipe edit screen will be described by way of recipe editing concerning the first-stage cleaning bath that performs cleaning with pure water.

Figure 6:
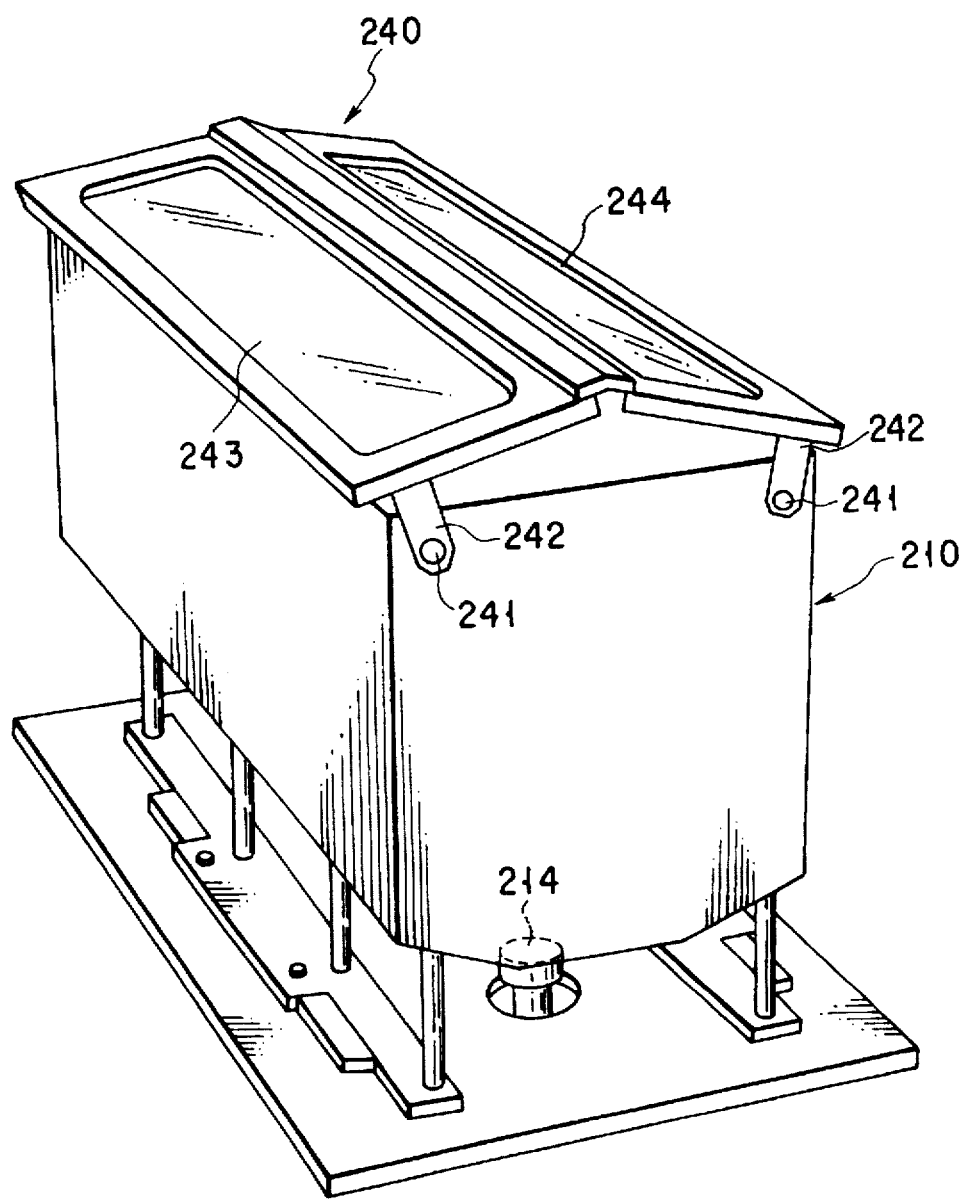
FIG. 6 is a perspective view of the cleaning bath shown in FIG. 4.

In the screen shown in FIG. 28, information concerning the first-stage water bath is shown in the form of a timing chart along a processing flow. In the example shown in FIG. 28, regarding these pieces of information concerning the first-stage water bath, those concerning the respective items of <pure water supply> indicating a processing flow of supplying pure water into the processing bath 211 through the supply port 214, as shown in FIGS. 4 to 6, <water discharge> of discharging water through a water discharge valve V, and <water sprinkling> of sprinkling water with a sprinkler pipe 230 are indicated time-serially in the form of timing charts and written figures. Parameters, e.g., a processing time in this example, concerning certain information is indicated near this information.

More specifically, in FIG. 28, (1) pure water is supplied to the bath for 30 seconds, and thereafter wafers are loaded. Furthermore, (2) pure water is supplied for 60 seconds, and thereafter (7) water discharge and (9) water sprinkling are performed simultaneously. When water discharging is performed for 10 seconds, the cleaning cycle is started. Pure water is supplied while sprinkling water again. Water sprinkling is stopped 30 seconds after it is started. Furthermore, pure water is supplied for 100 seconds, and (10) a cleaning cycle which completes upon performing water discharge and water sprinkling is executed three times. Thereafter, the wafers are unloaded, and then water sprinkling is performed. In this manner, since very complicated processing is indicated in the form of timing charts time-serially, the processing status can be visually grasped at a glance. As a result, even an operator not having a high-degree expert knowledge can understand the processing status only by following the displayed timing charts, so that the processing recipe can be set/corrected easily. Also, since the progress of processing can be visually grasped at a glance, an erroneous input can be minimized while setting/correcting the processing recipe.

Furthermore, according to the present invention, when the cursor is moved to near information arranged time-serially, i.e., to the portion of figure (1) in the example of FIG. 28, the processing time parameter concerning this information can be set or altered easily, so that processing can be performed easily, thereby improving the operability. In this case, even information concerning the parameter, i.e., the parameter which is to be altered currently in the example of FIG. 28, can be edited which performing confirmation, so that input errors can be minimized. In the example of FIG. 28, since all the processing recipes are displayed in one display, the processing status can be easily grasped visually at a glance, further improving the operability.

As described above, desired cleaning can be executed by selecting a processing recipe which is edited on a screen having a form of a time-series table from the wafer flow start menu of the ordinary operator screen.

The recipe forming menu will be described referring back to FIGS. 8 to 10. In the system parameter screen, parameters such as the temperatures of the respective processing baths and water bath, the alarm temperature at which an alarm should be produced, and the like can be set. In the fixed parameter screen, parameters such as liquid exchange in the respective baths, bath cleaning conditions, overflow time, and the like can be set. In the bath parameter menu, parameters such as the liquid disposing conditions of the respective processing baths, supply conditions, and the like can be set. In this manner, optimum cleaning is performed based on the processing recipe set by the parameters and the wafer flow recipe.

The maintenance menu shown in FIGS. 8 to 10 will be described. The maintenance includes the teaching control, the sensor status, and the alarm logging. Of these items, the teaching control displays a screen for performing position adjustment of the transfer system, e.g., the wafer transfer machine 140, the loader section 100, the unloader section 300, the conveyer machine 120, and the like, which is displayed when fine adjustment is necessary for the initial positions and operations of the machines. The sensor status displays a screen for displaying the status of the sensors provided at the respective portions of the cleaning machine, which is necessary when adjusting the status of the sensors as required. In the cleaning machine of this embodiment, information such as all the alarm times that have occurred in the machine, codes, statuses, and the like are recorded. These pieces of information can be displayed in the alarm logging and is referred to when performing maintenance.

Figure 29:
FIG. 29 shows a steady-state screen setting menu.

The service screen shown in FIGS. 8 to 10 will be described. The service screen includes the steady-state screen setting, the password setting, and the time setting. The cleaning machine of this embodiment has a function of automatically displaying a designated screen when a key operation is not performed exceeding a predetermined period of time. In the steady-state screen setting, items that the operator wishes to display and the time required for switching can be set in the steady-state screen shown in FIG. 29. As described previously, the engineer menu and the recipe forming are protected against a careless operator by passwords. When these passwords need be changed, they can be changed on the password setting screen. Furthermore, the system of the present invention has a time setting screen. This allows a change in the clock incorporated in the machine when necessary.

The expert operator menu, i.e., the recipe forming, the maintenance, and the service are generally operated manually by an expert operator having an expert knowledge. If, however, the expert operator leaves before completing the operation for some reason, the item which should not originally be accessed by a person other than the expert operator will be exposed to third parties defenselessly, and the processing recipe and the like may be undesirably altered or falsified depending on the case. For this reason, in the present invention, the steady-state screen as described above is prepared. More specifically, in the steady-state screen shown in FIG. 29, when the ordinary operator menu, e.g., the wafer flow start, the system information, the stand-by processing, the machine initializing, or the processing completion, is selected in advance as the steady-state screen shown in FIG. 29, if a key input is not made in the expert operator menu exceeding a predetermined period of time, e.g., for 50 seconds, the current screen can be automatically returned to the steady-state screen. As a result, the possibility that a third party other than the expert operator accesses the expert operator menu can be minimized, thereby warranting system security.

The interface between the control system for driving the cleaning machine 1 and the operator is formed in the manner described above, and can be driven in various modes when the operator designates a predetermined processing flow based on the various types of menus displayed on the operator display 261 of the controller 260. In this case, according to the present invention, the expert operator menu is protected by the steady-state screen restoring mode, so that it cannot be accessed by the ordinary operator, thereby guaranteeing system security. In addition, since the system information can be formed in an optimum manner in accordance with the user selection, the operability is improved.

In the above embodiment, the cleaning machine having a combination of cleaning units each including one chemical bath and two water baths is described. However, the present invention is not limited to this example, but can be applied to a cleaning machine having a combination of various types of processing baths, e.g., a cleaning unit including a plurality of chemical baths for performing processing with the same type of chemical, a cleaning unit including only one water bath, and the like.

In the above description, an embodiment of the present invention has been explained by way of a semiconductor wafer cleaning machine. However, the present invention is not limited to this, but can naturally be applied to a cleaning machine that cleans, e.g., LCD substrates and other components and members. Furthermore, the present invention is not limited to the cleaning machine, but can also be applied to an operator display used for controlling various types of processing machines, e.g., an etching machine and a film forming machine, that perform a predetermined processing operation consisting of a plurality of steps on a to-be-processed object, e.g., a semiconductor wafer or an LCD substrate, in accordance with a preset processing flow. Also in this case, system security can be guaranteed by discriminating an operator having an expert knowledge from an ordinary operator.

When a screen which is accessed frequently, e.g., the cleaning wafer flow start screen for instructing the start of the cleaning flow, the system initializing screen for instructing initialization of the respective machines, the stand-by processing screen for making an instruction so that the respective processing baths can accept the to-be-processed object, and the processing completion screen for instructing completion of processing; or a screen which will not likely be accessed by a third party is set as the steady-state screen, then the operability can be improved and system security can be improved.

When the system information screen displaying various types of information concerning the cleaning machine and the like is employed as the operator menu, the operator can confirm the status of the machine as required. In this case, if the system information is constituted by the fixed information which is displayed fixedly by the object processing machine and the user information having items that are selected by the user in advance from item information of the object processing machine, a flexible device information screen can be formed in accordance with the processing environment or operator. When such a system information is employed as the steady-state, system security can be warranted, and the status of the machine can be grasped as required, thereby improving the operability.

The ordinary operator screen, in particular the system information described above, can be visually recognized easily if it is displayed on one display, so that the operability can be improved. Even when these steady-state screens cover two displays or more, if the respective displays are sequentially switched at a predetermined cycle, they can be visually recognized easily, thereby improving the operability.

Furthermore, according to the present invention, information concerning the respective processing baths of the cleaning machine, e.g., the processing recipe, is formed into a time-series table in accordance with the processing flow, and the processing recipe table is displayed on the operator screen. Also, parameters corresponding to the individual pieces of information of the processing recipe table are displayed near the respective pieces of information, so that these parameters can be set/changed on this screen. As a result, even an operator not having high-degree expert knowledge can easily operate the system while minimizing input errors, by setting/changing the parameters as required in accordance with the information that are formed into the time-series table. Therefore, a user-friendly processing recipe setting/changing environment can be created.

Regarding the operator's operation, if the system is formed such that the operator can set/change a parameter corresponding to certain information by pointer-designating with a cursor or the like a portion near this information arranged on the operator screen time-serially through an interface device, e.g., a keyboard or a mouse, the operability can be improved.

If the system is formed such that, when a pointer designation is made, information concerning a parameter corresponding to the information indicated by the pointer is automatically displayed on the display simultaneously, then even an operator not having a high-degree expert knowledge can operate the system, while minimizing input errors.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A monitor controlling method of controlling a display of a master computer which displays a processing procedure of an object processing machine comprising a transfer section for transferring a to-be-processed object and a processed object, at least one processing unit for processing the to-be-processed object and a slave computer for controlling said transfer section and said processing unit in association with said master computer, comprising the steps of:

preparing a plurality of processing menus which respectively concern an ordinary operator who executes processing in accordance with an ordinary processing procedure and an expert operator who is in charge of adjustment of said object processing machine, and which include a plurality of processing items;

displaying only the processing menu concerning the ordinary operator when said master computer is powered on;

displaying the processing menu concerning the expert operator only upon input of a password by the expert operator; and displaying, when the ordinary operator and the expert operator respectively select the processing items of the corresponding processing menus, processing information corresponding to the selected processing items to be sent to and executed by said slave computer.

2. A method according to claim 1, wherein the step of displaying the menu concerning the ordinary operator includes at least a wafer flow start screen for instructing start of a wafer cleaning flow, a system initializing screen for instructing initialization of respective machines, a processing stand-by processing screen for instructing said respective processing baths to be set in a state to be able to accept the to-be-processed object, and a processing completion screen for instructing completion of processing.

3. A method according to claim 1, wherein the step of displaying the processing menu concerning the ordinary operator displays a processing menu comprising fixed information fixedly displayed by said object processing machine and user information consisting of items selected in advance by a user from item information of said object processing machine.

4. A method according to claim 1, wherein the step of displaying the processing menu concerning the ordinary operator displays a steady-state when a key operation is not performed exceeding a predetermined period of time.

5. A method according to claim 1, wherein the step of displaying the processing menu concerning the ordinary operator displays one steady-state on one display.

6. A method according to claim 1, wherein the step of displaying the processing menu concerning the ordinary operator displays a plurality of processing information items on a plurality of displays and sequentially switches the processing information items at a predetermined time cycle.

7. A method according to claim 1, which includes a step of allowing the expert operator to change processing information corresponding to the processing menu regarding the expert operator and displayed on the display.

8. A method according to claim 1, wherein at least one of the step of displaying the processing menu regarding the ordinary operator and the step of displaying the processing menu regarding the expert operator includes a step of displaying sequentially and selectively a plurality of hierarchical processing menus.

9. A method according to claim 8, wherein the step of displaying the processing menu regarding the expert operator includes a step of displaying sequentially upper and lower hierarchical processing menus regarding the expert operator in accordance with input of a password.

10. A monitor controlling method of controlling a display of a master computer which displays a processing procedure of a cleaning machine comprising a transfer unit for transferring a to-be-processed object and a processed object, a plurality of cleaning units for cleaning the to-be-processed object transferred by the transfer unit, and a slave computer for controlling said transfer unit and said cleaning unit in association with said master computer, comprising the steps of;

preparing a plurality of processing menus which respectively concern an ordinary operator who executes processing in accordance with an ordinary processing procedure and an expert operator who is in charge of adjustment of said cleaning machine, and which include a plurality of processing items;

displaying, when said master computer is powered on, fixed information which is included in the processing menu concerning the ordinary operator and is fixedly determined by said cleaning machine, and user information including processing items selected in advance by a user from processing items of said cleaning machine;

displaying the processing menu concerning the expert operator only upon input of a password by the expert operator; and displaying, when the ordinary operator and the expert operator respectively select the processing items of the corresponding processing menus, processing information corresponding to the selected processing items to be sent to and executed by said slave computer.

11. A method according to claim 10, wherein the step of displaying the processing menu concerning the ordinary operator displays the fixed information and the user information on one display.

12. A method according to claim 10, wherein the step of displaying the processing menu concerning the ordinary operator displays the fixed information and the user information on a plurality of displays and sequentially switches these information at a predetermined time cycle.

13. A method according to claim 10, wherein the step of displaying the menu concerning the ordinary operator includes at least a wafer flow start screen for instructing start of a wafer cleaning flow, a system initializing screen for instructing initialization of respective machines, a processing stand-by processing screen for instructing said respective processing baths to be set in a state to be able to accept the to-be-processed object, and a processing completion screen for instructing completion of processing.

14. A method according to claim 10, wherein the step of displaying the processing menu concerning the ordinary operator displays a processing menu comprising fixed information fixedly displayed by said object processing machine and user information consisting of items selected in advance by a user from item information of said object processing machine.

15. A method according to claim 10, wherein the step of displaying the processing menu concerning the ordinary operator displays a steady-state when a key operation is not performed exceeding a predetermined period of time.

16. A method according to claim 10, which includes a step of allowing the expert operator to change processing information corresponding to the processing menu regarding the expert operator and displayed on the display.

17. A method according to claim 10, wherein at least one of the processing menu regarding the ordinary operator and the step of displaying the processing menu regarding the expert operator includes a step of displaying sequentially and selectively a plurality of hierarchical processing menus.

18. A method according to claim 17, wherein the step of displaying the processing menu regarding the expert operator includes a step of displaying sequentially upper and lower hierarchical processing menus regarding the expert operator in accordance with input of a password.

19. A monitor apparatus for monitoring a processing procedure of an object processing machine comprising a transfer section for transferring a to-be-processed object and a processed object, at least one processing unit for processing the to-be-processed object, and a slave computer for controlling said transfer section and said processing unit in association with a master computer, comprising:

storing means for storing a plurality of processing menus which respectively concern an ordinary operator who executes processing in accordance with an ordinary processing procedure and an expert operator who is in charge of adjustment of said object processing machine, and which include a plurality of processing items;

input means operated by the expert operator for inputting a password;

read out means for reading out only the processing menu concerning the ordinary operator from said storing means when said master computer is powered on, and the processing menu concerning the expert operator from said storing means only when the password is input by the expert operator; and display means provided on said master computer for displaying the processing menus concerning the ordinary operator and the expert operator read out by said read out means, respectively, and for displaying, when the ordinary operator and the expert operator respectively select the processing items of the corresponding processing menus, processing information corresponding to the selected processing items to be sent to and executed by said slave computer.

20. A monitor apparatus according to claim 19, wherein said display means displays the menu concerning the ordinary operator which includes at least a wafer flow start for instructing start of a wafer cleaning flow, a system initializing for instructing initialization of respective machines, a processing stand-by processing for instructing said respective processing baths to be set in a state to be able to accept the to-be-processed object, and a processing completion for instructing completion of processing.

21. A monitor apparatus according to claim 19, wherein said displaying means displays the processing menu concerning the ordinary operator and comprising fixed information fixedly displayed by said object processing machine and user information consisting of items selected in advance by a user from item information of said object processing machine.

22. A monitor apparatus according to claim 19, wherein said displaying means displays the processing menu concerning the ordinary operator and including a steady-state when a key operation is not performed exceeding a predetermined period of time.

23. A monitor apparatus according to claim 19, wherein said display means displays the processing menu concerning the ordinary operator and including a steady-state on one display.

24. A monitor apparatus according to claim 19, wherein said displaying means displays the processing menu concerning the ordinary operator and including a plurality of processing information items on a plurality of displays and includes means for sequentially switching the processing information items at a predetermined time cycle.

25. A monitor apparatus according to claim 19, which includes means for allowing the expert operator to change processing information corresponding to the processing menu concerning the expert operator and displayed on said display means.

26. A monitor apparatus according to claim 19, wherein said display means displays at least one of the processing menu concerning the ordinary operator and the processing menu concerning the expert operator and also displays sequentially and selectively a plurality of hierarchical processing menus.

27. A monitor apparatus according to claim 26, wherein said display means displays sequentially upper and lower hierarchical processing menus concerning the expert operator in accordance with input of a password.

* * * * *